(12) United States Patent
Roncetti et al.

(10) Patent No.: US 10,277,724 B2
(45) Date of Patent: Apr. 30, 2019

(54) ERGONOMIC ACCESSORY FOR SMARTPHONES AND OTHER HAND-HELD PORTABLE ELECTRONIC DEVICES

(71) Applicants: Peter M. Roncetti, New York, NY (US); Robert S. Gluck, Naples, FL (US)

(72) Inventors: Peter M. Roncetti, New York, NY (US); Robert S. Gluck, Naples, FL (US)

( * ) Notice: Subject to any disclaimer, the term of this patent is extended or adjusted under 35 U.S.C. 154(b) by 0 days.

(21) Appl. No.: 16/150,835

(22) Filed: Oct. 3, 2018

(65) Prior Publication Data

US 2019/0075197 A1    Mar. 7, 2019

Related U.S. Application Data

(63) Continuation-in-part of application No. 15/525,528, filed as application No. PCT/US2015/060868 on Nov. 16, 2015.

(60) Provisional application No. 62/082,314, filed on Nov. 20, 2014.

(51) Int. Cl.
*H04M 1/02*    (2006.01)
*H05K 5/02*    (2006.01)

(52) U.S. Cl.
CPC ........ *H04M 1/0283* (2013.01); *H05K 5/0204* (2013.01)

(58) Field of Classification Search
CPC ............................ H04M 1/0283; H05K 5/0204
See application file for complete search history.

(56) References Cited

U.S. PATENT DOCUMENTS

| | | | |
|---|---|---|---|
| 3,804,307 A | 4/1974 | Johnston | |
| 6,044,153 A | 3/2000 | Kaschke | |
| 6,044,453 A * | 3/2000 | Paver | G06F 9/3842 712/201 |
| 8,622,447 B1 | 1/2014 | Wirtz | |
| 2007/0278265 A1* | 12/2007 | Contente | A45F 5/00 224/162 |
| 2008/0083797 A1 | 4/2008 | Myers | |
| 2008/0222849 A1 | 9/2008 | Lavoie | |

(Continued)

OTHER PUBLICATIONS

International Search Report for corresponding application PCT/US2015/060868 dated Mar. 7, 2016.

*Primary Examiner* — Brandon J Miller
(74) *Attorney, Agent, or Firm* — Norris McLaughlin, P.A.

(57) ABSTRACT

Injury to the digits, hand and wrist are associated with the frequent usage of portable hand-held electronic devices ("PEDs"), including but not limited to smartphones. This is true as well for injury to the neck and shoulder areas. The potential for injury to the digits, hand and wrist in particular is anticipated to be exacerbated by the larger smartphones, and especially the tablet-like smartphones. The ergonomic accessory of the invention has several embodiments whose design is intended to ameliorate if not prevent such injuries. Certain embodiments are partially or fully case-like in form so that they envelope to a greater or lesser degree, such hand-held electronic devices. Another embodiment attaches to a PED through an element of the PED such as the charging socket. The accessory also removably attaches the hand of the user or provides a secure holding surface for the user.

16 Claims, 22 Drawing Sheets

(56) References Cited

U.S. PATENT DOCUMENTS

| | | | |
|---|---|---|---|
| 2012/0063066 A1* | 3/2012 | Floit | A45F 3/14 361/679.01 |
| 2013/0113229 A1* | 5/2013 | Wu | H04M 1/04 294/138 |
| 2013/0148295 A1* | 6/2013 | Minn | G06F 1/163 361/679.59 |
| 2014/0120983 A1 | 5/2014 | Lam | |
| 2014/0202886 A1* | 7/2014 | Kim | A45F 5/00 206/38 |
| 2015/0018045 A1* | 1/2015 | Cha | H04M 1/0266 455/566 |

\* cited by examiner

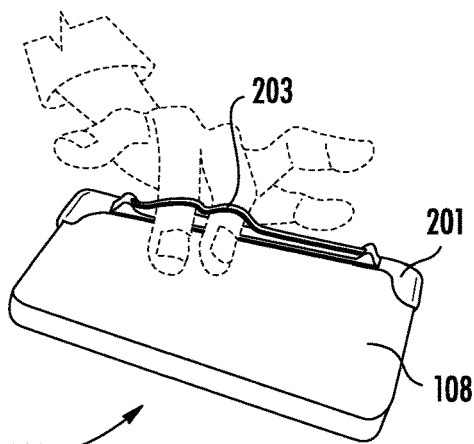
FIG. 6A
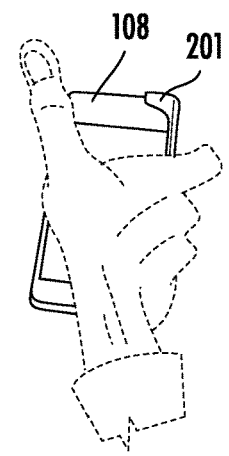
FIG. 6B
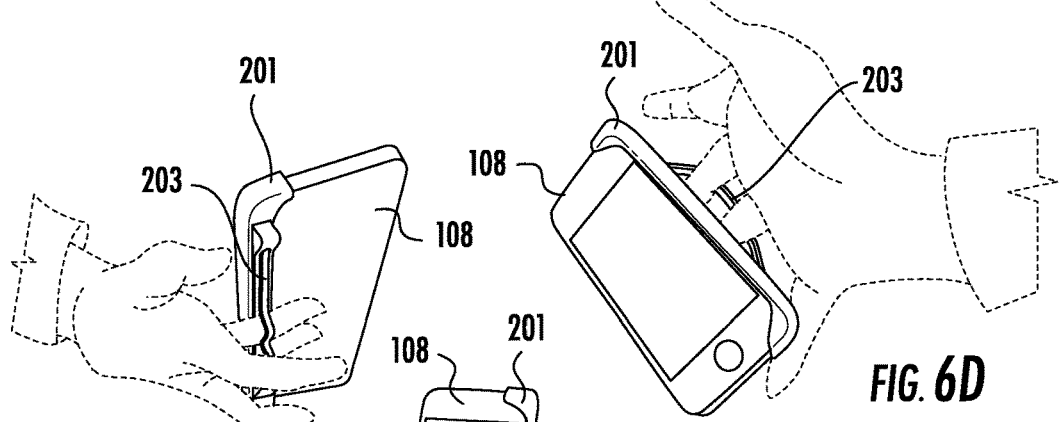
FIG. 6C
FIG. 6D
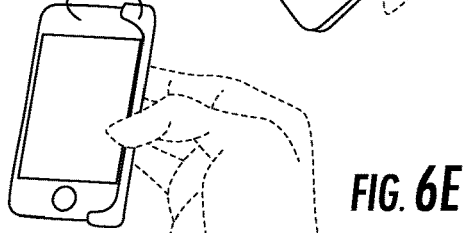
FIG. 6E
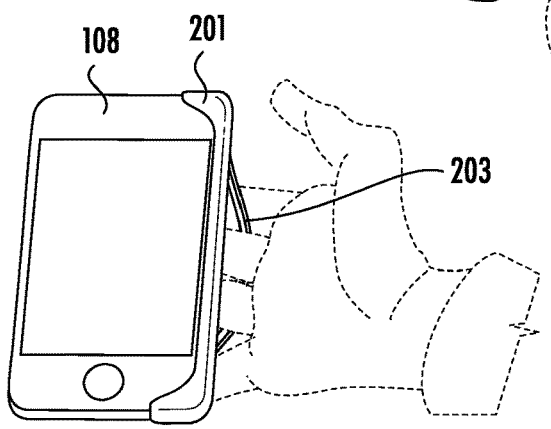
FIG. 6F
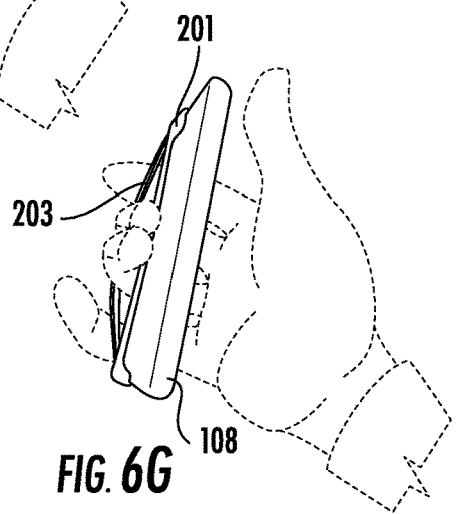
FIG. 6G

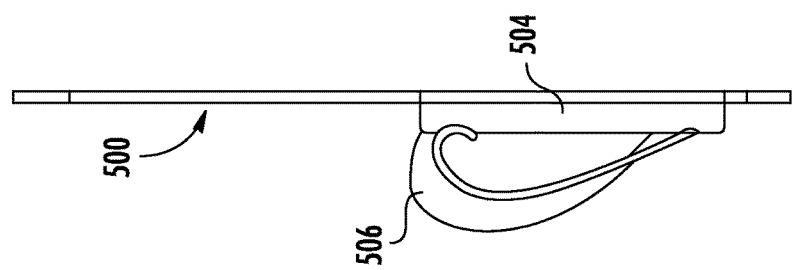
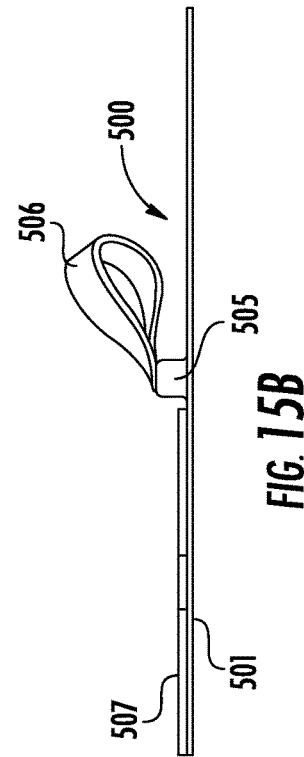
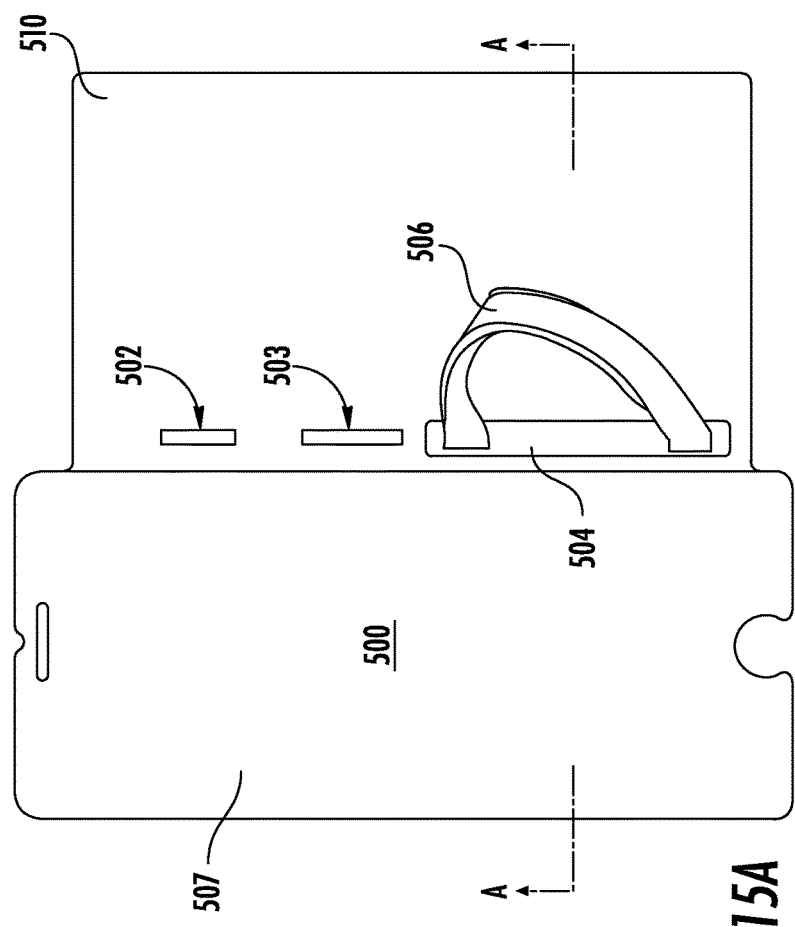

ERGONOMIC ACCESSORY FOR SMARTPHONES AND OTHER HAND-HELD PORTABLE ELECTRONIC DEVICES

CROSS-REFERENCE TO RELATED APPLICATION

This non-provisional application is a continuation-in-part of application Ser. No. 15/525,528 filed May 9, 2017 which in turn claims priority from U.S. provisional application Ser. No. 62/082,314, filed Nov. 20, 2014 and entitled "Adjustable Accessory Having Optional Wearable Technology for Connecting a Hand Held Device to the Finger(s) of the Device User."

BACKGROUND OF THE INVENTION

Field of the Invention

An ergonomic accessory having the various embodiments of the present invention are intended to facilitate the safe use of portable hand-held electronic devices ("PEDs"), particularly smartphones and the larger tablet-like devices often referred to as "phablets." In certain embodiments, this ergonomic accessory is designed to envelope to a greater or lesser degree, and thus attach to a PED in a partial, or fully, case-like manner. Another embodiment involves connection of the ergonomic accessory of the present invention directly to a PED at a single point, or locus, of attachment. This ergonomic accessory, depending on specifically which of the proposed embodiments is chosen and which of the various ergonomic features are employed in its design, is securely joined to the hand of the user by a simple gripping action, or by connection to one or more of the digits of the hand in a tethering action by way of a strategically placed ergonomic cord, the result being a conjoinment of user and PED.

The Related Art

The human hand, and the extended hand/wrist "system," are extraordinarily complex anatomically, comprising a carefully articulated construct of bones, joints, ligaments, tendons, muscles and nerves. Misuse, including excessively frequent, prolonged and/or forceful use, may lead to a variety of adverse musculoskeletal and nervous system health effects commonly referred to as Repetitive Strain Injuries ("RSI's"), known also as "repetitive stress injuries" or "cumulative trauma disorders." Signs of such injury may include aches, pains, soreness, a burning or tingling sensation, spasms, tenderness, swelling and fatigue. Continued overuse may in turn lead to chronic musculoskeletal injuries such as arthritis (particularly at the base of the thumb), tendonitis, bursitis, and de Quervain Syndrome (inflammation, or stenosing tenosynovitis, of the tendon sheath in the thumb). Perhaps the most well known and widely treated such injury is Carpal Tunnel Syndrome, involving inflammation of the sheath surrounding the nerve bundle connecting hand to arm as, for example, a result of excessive keyboard use.

Problems of this type have long been well known and documented in traditional industries. Such injuries started to surface anew globally in the workplace in the 1970s as attributed to the widespread use of computers requiring long periods of repetitive motions at a keyboard. Beginning in the 1980s, with the advent of new personal technologies, issues known in the common vernacular as "Nintendo Thumb" and "Gainer's Grip" were emerging. More recently, neologisms such as "BlackBerry Thumb," "Cellphone Thumb," and "Texter's Thumb" (all more broadly referred to by some as "iPhonitis") have been applied to injuries related to the use of smartphones in particular.

Recently too, what is referred to as "Text Neck" has drawn a focused concern. This painful condition may result from the extreme bending forward of the head, and the consequent strain to the musculoskeletal system in the neck and shoulder/upper back area, necessary to view and manipulate the screen of a PED when held in its customary (i.e., more horizontal than vertical) position. Overly frequent and/or prolonged PED usage can precipitate or exacerbate this condition.

Determining a specific diagnosis from the symptoms described above may be difficult enough, and drawing a definitive linkage to excessive use of PEDs may be even more speculative yet in each individual circumstance. However, it is clear that as PEDs assume an even more fundamental role in everyone's day-to-day lives, the health issues described above are becoming of increased concern and greater in apparent incidence. Evidence of such problems, certainly from at least an anecdotal viewpoint, are on the rise. The increasing trend toward the use of the larger smartphones (i.e. "phablets") of increased screen size, is fully expected to exacerbate hand injury potential.

Usage of PEDs, smartphones in particular, involves the simple act of gripping the device to make it secure in the hand and to facilitate its manipulation. An excessively tight grip may lead to undue pressure on the soft tissue of the hand and digits; the resultant tissue compression, and its accompanying impact on the nerves and the obstruction of free blood flow, may lead to numbness, a tingling sensation, and other disorders. This is especially so with overly frequent or prolonged PED usage.

Smartphone usage also involves manipulation of the controls of the device by pushing buttons and touching and tapping at the screen surface. The fingers, in various modes and combinations, may be used for these purposes. Soft tissue issues similar to those described above may also occur in the fingers as a result of excessively frequent, prolonged and/or forceful such use.

The thumb alone may be principally involved in the operation of a PED/smartphone when the device is used in one hand only (thereby leaving the second hand free to accomplish other tasks). Soft tissue injury and other more serious problems to the thumb may occur, such as irritation, swelling, strained muscles and inflammation of the tendon sheath of the thumb. Further problems may occur at the base of the thumb when the device is pressed too firmly at this location or when the thumb is repeatedly used in an awkward position to reach all smartphone screen areas.

SUMMARY OF THE INVENTION

The accessory of the present invention, depending on which of its proposed embodiments is chosen, incorporates key ergonomic features, or elements, designed to mitigate adverse health effects to the hand and digits as well as to the neck/upper torso area.

First, the ergonomic accessory, in one embodiment, employs flexible, resilient and compliant cushions integrated into a case-like structure that fully circumscribes the edges of a PED. These cushioned elements are placed at the customary gripping positions of the PED such that the desired ergonomic benefits are realized.

Second, the ergonomic accessory, in another embodiment, incorporates a tether element, or cord, attached at a peculiar and particular location on the accessory body in a configuration designed to couple and conjoin the digit(s) and hand of the user to the PED. The tether element joins the body of the ergonomic accessory at two points in such manner that when the ergonomic accessory is attached to the PED, the digit(s), when inserted beneath the tether, will lay between the tether element and the PED. This type of tethering arrangement is proposed in two embodiments, one in which the tether element is located at the side edge of a PED, and one in which the tether element is at the rear face of a PED, when the ergonomic accessory to which the tether element is combined is clipped, or joined to, the PED. The body of the ergonomic accessory is proposed to be of a partial case-like form, and alternatively it may be in the form of a full case-like form which completely circumscribes the periphery of a PED.

The first and second general embodiments of the ergonomic accessory may be employed separately as described, or both embodiments may be combined together in a single embodiment providing the full range of ergonomic advantages.

Alternatively, in a further embodiment of the ergonomic accessory of the invention, the tether element may attach at a single point at the bottom edge of a PED in various manners. The tether element is designed to envelope one or more digits in a loop fashion at its far end with the result of joining the user to the PED such that the accessory's ergonomic benefits are employed.

The ergonomic purposes and benefits of these various embodiments of the accessory of the present invention are set forth in detail below.

A highly flexible, elastic and compressible element will, to a greater or lesser degree, comprise both side edges of a case-like PED/smartphone ergonomic accessory. By compressing and conforming to the shape of the hand and digits pressing along the edges of the accessory, such cushioned side-edge elements of the ergonomic accessory will spread the grip forces acting against the user's soft tissue. Thus, for any given magnitude of grip force that may be exerted, grip pressure (measured as force per unit of area upon which such force is exerted) on the soft tissue will be reduced as the force is extended over a greater total tissue surface area. Soft tissue injury potential will accordingly be diminished.

The sufficiently flexible, form-changing ergonomic side-edge cushion elements of the ergonomic accessory of the present invention will do even more to mitigate soft tissue injury due to mechanical compression. By virtue of conforming to the contours of the hand and digits, the cushioned side-edge elements will, in the first instance, allow for a softening of the grip on the PED necessary to hold and manipulate it without fear of losing control of and/or dropping the device. Simply put, the PED will not so easily be able to slide out of the hand as would be the situation with conventional PED cases having hard, smooth, glossy or polished—and thus slippery—surfaces. The end result is an even further reduction in the pressure exerted against the soft tissue of the hand and digits which is necessary to control a PED.

A textured surface to the ergonomic side-edge cushion elements, coupled with the use of a "sticky" non-slip surficial material used in their construction, will enhance these ergonomic benefits by producing a yet further incremental reduction in the need to tighten the grip on a PED necessary to secure and use it. Additionally, these ergonomic side-edge elements will not only be highly compressible, they will be highly elastic, rebounding to their original shape very quickly. These elastic edges will thus be available to be recompressed so as to provide the desired cushioning effect again and again as the hand and digits are continually moved along the PED edges. The extent to which the side-edge ergonomic elements will be designed to change shape against grip forces will, while maintaining the desired ergonomic benefit, be tempered by the need to allow unfettered movement of the hand and digits necessary for free use of a PED.

A tether element is incorporated into one embodiment of the ergonomic accessory. When the ergonomic accessory is coupled to a PED in the manner intended by virtue of its design, this tether element will be positioned peculiarly, particularly and importantly to reside most proximate to, and facing, the palm of the hand in which the device is used. This ergonomic tether element is described herein in different embodiments to be placed on the ergonomic accessory at its side edge or at its rear face. The ergonomic accessory itself may, as preferred, be of a partial, or a full, case-like design.

The ergonomic tether element will have elastic properties and will have an optimum level of initial elastic tension in its unused, or "resting" position so as to provide both comfort to the user and a secure joining action of the digits of the hand to the ergonomic accessory/PED couplet. To achieve the proper level of tension (and thus tightness) for individual functionality and comfort purposes, the initial tension level of the ergonomic tether element can be adjusted by way of a friction slide incorporated into the ergonomic accessory's design. It is intended that the PED user will insert any digit or combination of digits between the tether and the ergonomic accessory/rear PED surface. In so doing, the tether element will serve to comfortably enfetter, or conjoin, the user to the PED.

The user may insert the digits as little, or as far forward beneath the tether element as he or she wishes to do. In any and all such positions employed, the PED will be securely held for use in defiance of the effects of gravity. In addition, the tether, due to its positioning on the ergonomic accessory, prevents the PED from flipping, or rotating, out of the hand even when the PED is balanced at the very tips of the fingers.

By virtue of the design and properties described above, the tether element of the ergonomic accessory allows the PED user to rotate the palm of the hand to a more vertical position (in relation to the horizontal plane of the screen of the PED) when compared to the use uncased PEDs or conventional PED cases. This is a subtle but critical advantage in that it allows the thumb to be placed more "over the top" of the screen, thus enabling it to more easily reach all sectors of the device's screen, both near and far, including those screen sectors referred to as the "strain" areas. This places a lower level of strain on the thumb through its less awkward positioning and a reduction in movement required at the extremes of its range of motion. What is accomplished here is a reduction in the degree of abduction of the thumb, an important predisposing factor in the production of RSI to the thumb. This is a special advantage to the use of the larger hand-held phablet devices which are seen in increasing usage. Viewed another way, the thumb has "grown longer" in terms of its ability to manipulate the previously more remote, less reachable screen areas that fall out of the user's "comfort zone." The key to enabling these extreme positional placements and movements of the thumb, and providing the functional and ergonomic benefits described, is the ergonomic accessory's unique positioning of the tether at the extreme edge of the PED proximate to the palm of the hand. Noteworthy too, the more vertical repositioning of the hand allowed through use of the tether has an additional benefit to the wrist, allowing it to remain in a more neutral position of lesser strain.

The tethering arrangement described above allows for a looser grip (if not entirely eliminating the need for employment of any gripping action at all) on the PED without fear of it being dropped. This means a more relaxed hand. The correspondingly "softer touch" of the thumb that this enables helps to compensate for its lower degree of dexterity (when compared to the fingers). The net effect is even less strain on the thumb. And, by allowing the thumb to operate more in its comfort zone, rather than at the strained extremes of its range of motion, speedy use of a smartphone—particularly during testing—is not compromised as it might otherwise be.

The tethering arrangement also reduces the need for excessive movement of the four digits of the hand (i.e., those other than the thumb), and the larger hand, to control the PED and manipulate the touch screen, reducing in turn the potential for fatigue and the more serious adverse repetitive motion injury effects.

While, in the use of the ergonomic accessory, the tether element is at its ends fixed in position in relationship to the body of the PED (as may be true of other alternative devices intended to connect the user to the PED), as a concept the tethering arrangement alone confers the advantage of allowing the hand and digits to "roam" spatially in a generally unimpeded way vis a vis the body and screen of the PED. The effect is as though the tether itself is moving in the way that its functionality is maintained. Viewed another way, the PED is in a sense "floating" on the fingertips of the user. The fingers held by the tether element are still able to freely move up and down in the direction of the vertical axis of the PED, and to move further in or out from the grasp of the tether element along the longitudinal axis, or width, of the PED, all the while enabling the ergonomic benefits of the tether as described above to be maintained as the thumb reaches for all areas of the screen, near and far and whenever and wherever needed. As these ergonomic benefits are conferred, the tether element continues to do its job holding the user's digits in a loose relationship (where such looseness too, is an ergonomic advantage), lightly but securely, to the PED.

The tethering arrangement also eliminates the fear of the PED being dropped. Wrist flexion and torsion can thereby be reduced when the effects of gravity are no longer to be feared. The consequent ability to maintain the wrist in a "neutral" position where it is straight, and not bent, will reduce the potential for overuse and injury surfacing at the wrist as well as the hand.

In another embodiment, a cord element of the ergonomic accessory of the present invention may connect to a PED at a single point either directly through a connecting component, or by attachment to a partial or full case-like component enveloping to varying degrees, the PED. At an intermediate point in its length, the cord element is proposed to be looped around one or more digits of the PED user, as preferred, thus completing the PED/user connection. In so doing, all of the ergonomic benefits described in the above section will obtain.

In this embodiment, the ergonomic accessory has the broader purpose of serving as a physical platform into which, as may be desired, a broad and potentially unlimited variety of external technological components related to the function and capability of PEDs may be introduced in a "wearable" form. Decorative components may be added to the cord element as well such that it becomes an item of jewelry, or fashion.

Conventionally, a PED is used with the screen more in the fully, or near fully, horizontal position such that the device can be held securely and not dropped. The result is that the user is viewing the screen with the head tilted downward, very often to an extreme degree. This places the head/neck/shoulder musculoskeletal complex in an unnatural position whereby excessive strain may obtain. Such excessive strain may in turn lead to concomitant pain, injury and other adverse manifestations. This is the essence of what is referred to as the "Text Neck" issue. (The ergonomic design of computer workstations, by considering the viewing angle toward keyboard and video display, involves a focus on eliminating this type of postural extreme so as to provide for user comfort, greater productivity and a reduced injury potential.)

In another embodiment of the invention, the ergonomic accessory is affixed to a PED, particularly a smart phone, such that the accessory's ergonomic attributes can be functionally realized. The key to this embodiment is that a standard screen protector is integrated into the ergonomic accessory as a principal and adjunctive component which serves as the primary means by which the ergonomic accessory is held securely at the front, screen surface, of the PED. This novel approach takes advantage of the fact that such screen protectors are commercially available and widely employed by PED users to cover their device's screen surfaces. By so joining the ergonomic accessory to the screen protector as a single product, two important functions are achieved. And, very importantly, this conjoining solves the otherwise difficult task of trying to determine how to otherwise attach the ergonomic accessory to a PED in a highly secure, but physically compact and discrete manner.

A key ergonomic benefit to the tether or cord elements of the ergonomic accessory of the present invention in its several embodiments, is that in contrast to what is described above, it enables the PED to be held in the near-vertical, or if desired even the fully-vertical, position for viewing and manipulation of the screen. Such is the case even when only the very tips of the fingers are inserted into the tether element as shown in the first two of these figures. This upright use of the PED can be accomplished without fear of a loss of control or dropping of the device. The result is that with head-on viewing of a vertically-positioned screen, the head need not be pitched forward at all, and certainly not to any extreme, thus confronting and providing a solution to the "Text Neck" risk at very outset. And, while this vertical use of the PED is enjoyed, the wrist is held in a more neutral position as a subsidiary, and itself important, ergonomic advantage.

BRIEF DESCRIPTION OF THE DRAWINGS

FIGS. 6A-6G illustrate various views of the fifth embodiment of the invention in actual usage.

FIGS. 15A, B and C illustrate the elements of a ninth embodiment of the invention in plan, bottom and side elevation.

DETAILED DESCRIPTION OF THE PREFERRED EMBODIMENTS

Generally speaking, the ergonomic accessory comprises a first means of securely attaching the accessory to a PED or other personal device and a second means of a) removably attaching such device to the hand of an individual who uses the PED or b) providing a secure holding surface for the hand of the user. Of course, the accessory can be removed from the PED if a person wishes to do so, but it is sufficiently secured to the device so that it won't be removed or come off unintentionally.

Figure 1:
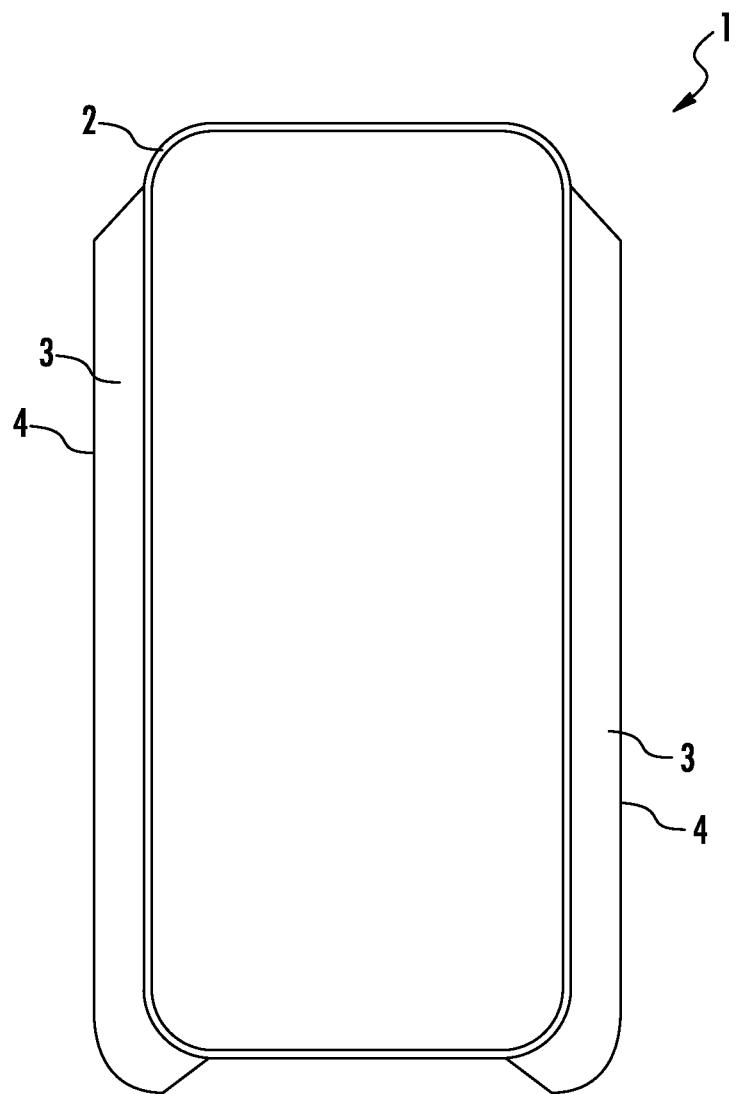
FIG. 1 is an elevation view of a first embodiment of the ergonomic accessory.

Referring to FIG. 1, this first embodiment of the ergonomic accessory of the present invention 1 employs compressible side-cushion elements 3 which are attached as added ergonomic elements to conventional PED cases which are sited to receive and securely hold them in a PED, such as what is commonly referred to as a "bumper" case 2, having two opposing elongated sides with a cushion affixed to each side. The compressible material from which these side-cushion elements 3 are fabricated are highly elastic in nature such that the cushions will compress and rebound very quickly so as to continually be available to provide a cushioning effect as the digits and hand are moved in the manner necessary to operate the PED. The skin, or surficial covering material 4, for these cushion elements 3 is textured to minimize the possibility of the PED slipping out of the hand at any given grip force being used to hold the PED. In addition, the surficial material 4 is comprised of a substance, such as urethane, that possesses an inherently "sticky" characteristic. The net benefit of these properties, texture and stickiness, is that a PED may be handled, controlled and manipulated with a looser grip. A looser, more relaxed grip in turn minimizes the potential for ergonomic injury to soft tissue of the hand and to the joints given repetitive, overly frequent and prolonged PED usage.

Figure 2A:
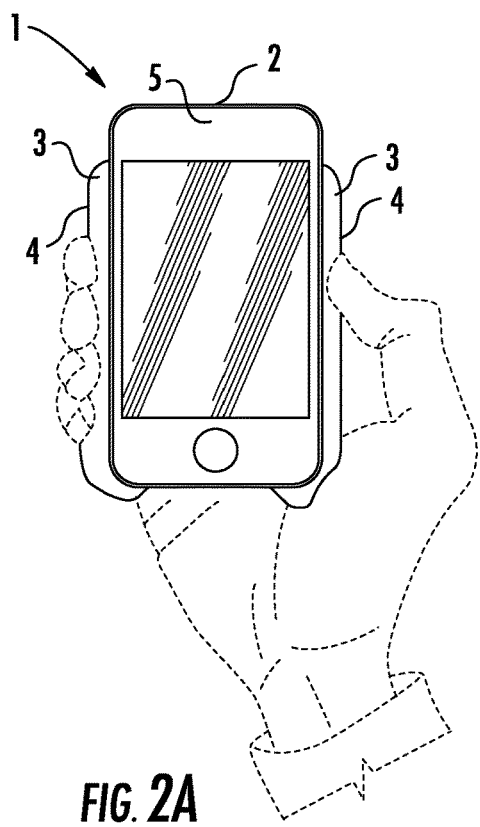
FIGS. 2A and 2B illustrate the first embodiment of the invention in actual usage with different positions of a hand.

FIG. 2A shows the accessory 1 in typical "bumper" case 2 form as it may be positioned to protect a PED 5. FIG. 2A shows the hand, and the digits of the hand, as they may typically be employed to grasp the side-cushion elements 3 so as to operate the PED 5. This view, FIG. 2A, shows how the side-cushion elements 3 are strategically placed so as to provide contact with the soft tissue of the hand and digits in an ergonomically protective manner.

Figure 2B:
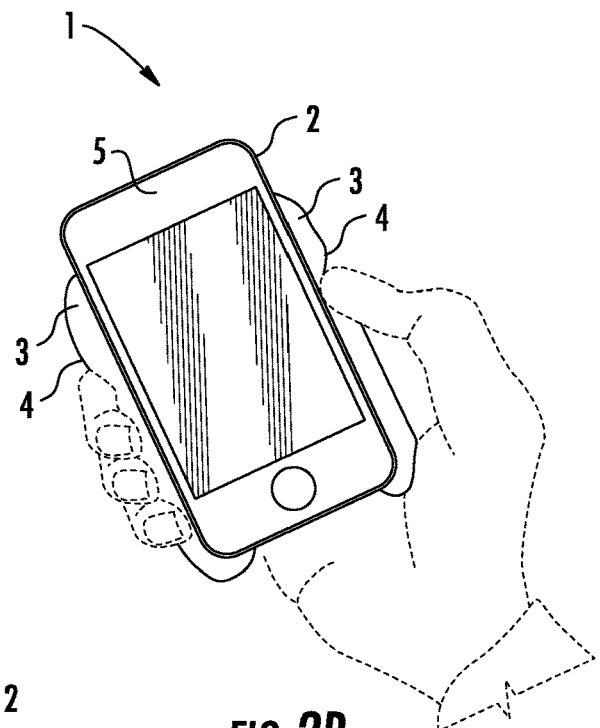

FIG. 2B is similar to FIG. 2A, except that it more clearly shows the concordant pattern of deformation of the side-cushions 3 in response, and in relationship to, the grasping positions of the hand and digits.

Figure 2C:
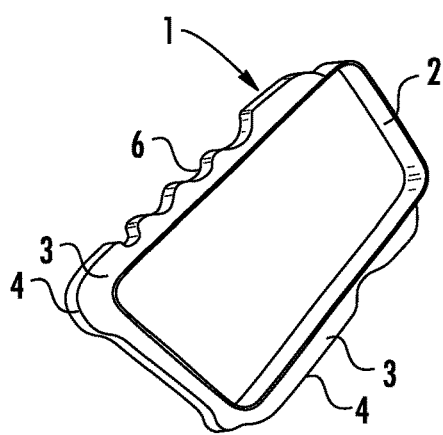
FIG. 2C illustrates a typical pattern of deformation of cushions of the first embodiment of the invention.

FIG. 2C depicts such deformations 6 along the lengths, and at the lower-right corner of, the side-cushion elements 3 with the hand and digits, and the PED 5, not shown in this drawing. This view shows how these side-cushion element 3 deformations 6, whether shallow or deep, will help prevent the PED from slipping out of the hand. This feature, together with the textured, "sticky" properties of the surface 4 of the side-cushion elements 3 earlier alluded to, are key to enabling the PED to be controlled and operated with ergonomically-improved lighter grip forces.

FIGS. 3A, 3B and 3D-3H depict a second embodiment of an ergonomic accessory 100 employing a tether element 103 attached to the accessory body 101 at two locations, namely at both ends of the tether element 103. In this particular embodiment, the tether element 103 is attached to the body 101 of the ergonomic accessory 100 so that, when coupled to a PED 108 (depicted in dotted lines) in its manner of intended usage, this tether element 103 is positioned at the side edge of both the ergonomic accessory 100 and the PED 108 proximate to the palm of the hand of the user (as depicted in the various views provided in FIGS. 4A-4G).

In FIGS. 3A, 3B and 3D-3H, the body 101 of the ergonomic accessory 100 is in the form of a partial PED "case," such that it envelopes and is affixed to only one side and two adjacent corners of a PED, and not the four sides and four corners of a PED in the manner of a the typical PED protective case. This accessory 100 design is intended to be minimally intrusive to the aesthetics, feel, operation and storage of the PED. As such, the accessory 100, is "minimalist" in nature such as it is, is intended to primarily and uniquely serve its ergonomic purposes and provide its ergonomic benefits as heretofore described.

Figure 3A:
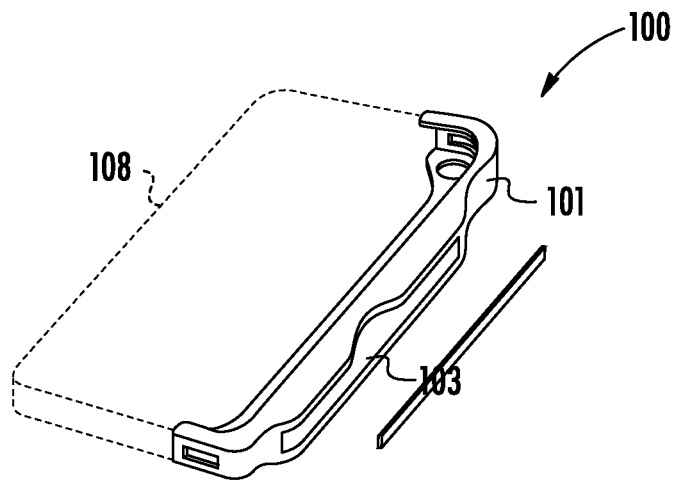
FIGS. 3A and 3B are perspective views of a second embodiment of the ergonomic accessory having a side-mounted tether element. A dotted line depiction of a PED is included.
Figure 3B:
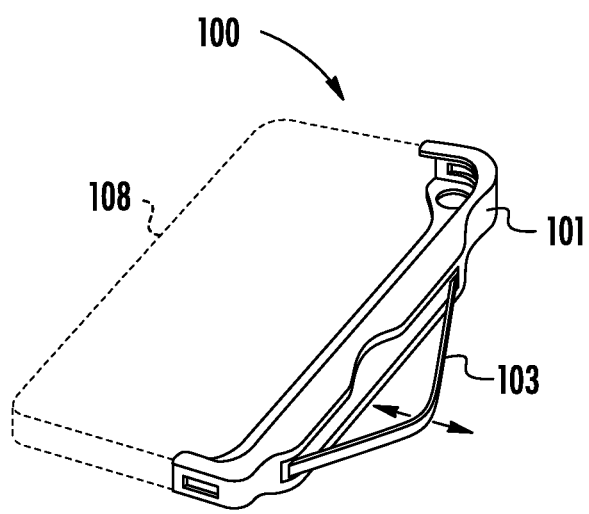
Figure 3C:
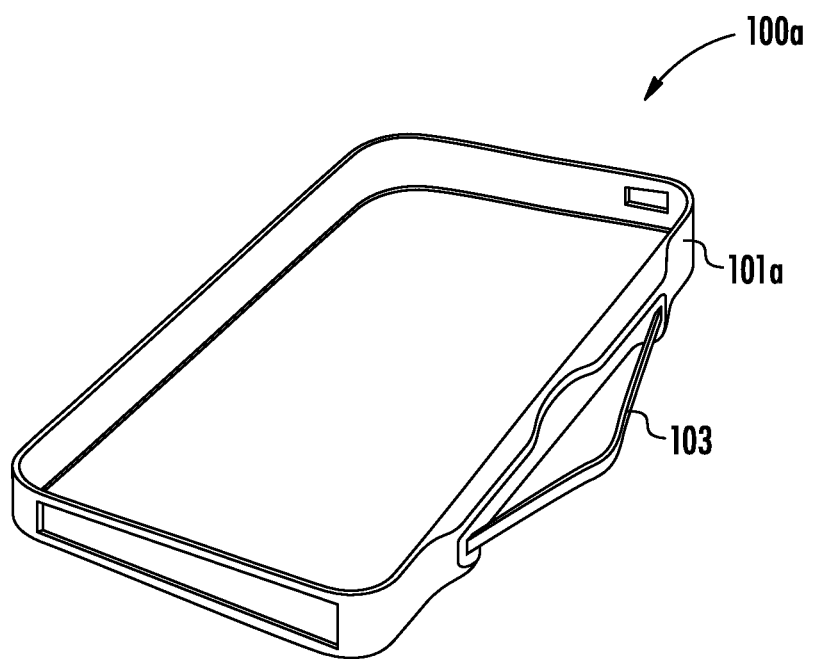
FIG. 3C is a perspective view of a third embodiment of the ergonomic accessory having a side-mounted tether element.

FIG. 3C shows, alternatively, a third embodiment 100*a* with its body 101*a* depicted in a full protective "bumper case"-like design. While the body 101*a* of the ergonomic accessory may actually be designed to take many forms in serving as a partial case-like or full PED case, the tether element 103 on the other hand must remain in its position and design as the key, unique and unalterable ergonomic component of the accessory of the present invention.

FIG. 3A shows the ergonomic accessory 100 with the side-tether element 103 in its "resting," or unused, position as it lays against the side of the body 101 of the ergonomic accessory 100. FIG. 3B provides the identical view, except that the tether element 103 to the ergonomic accessory is shown in its "stretched" position. In this position, the tether element 103 is separated away from body 101 of the accessory 100 such that the digit(s) of the hand may be inserted between the accessory body 101 and the tether 103 itself. This stretching of the tether element 103 is done simply by the user of the accessory 100 grabbing the tether element 103 between thumb and another digit and pulling on it.

Figure 3D:
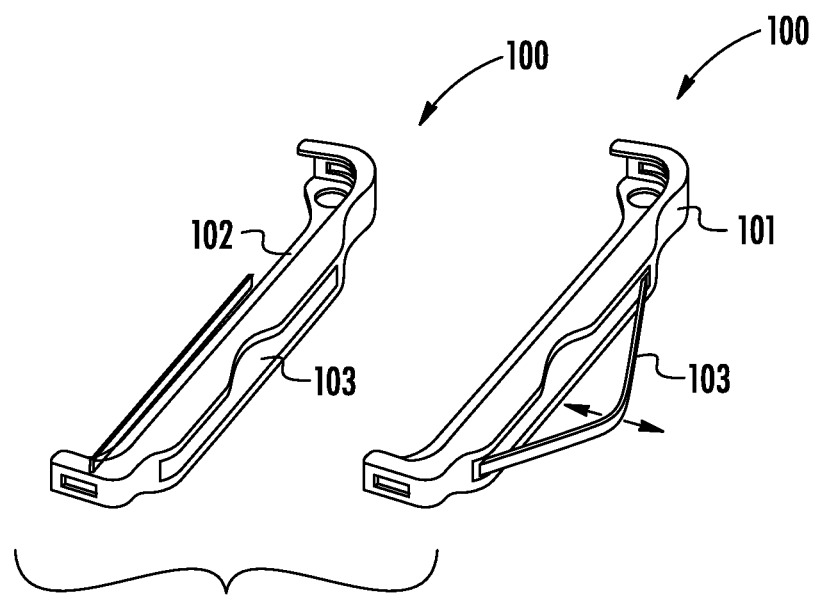
FIG. 3D illustrates the second embodiment of the invention with a liner element 102.
Figure 3E:
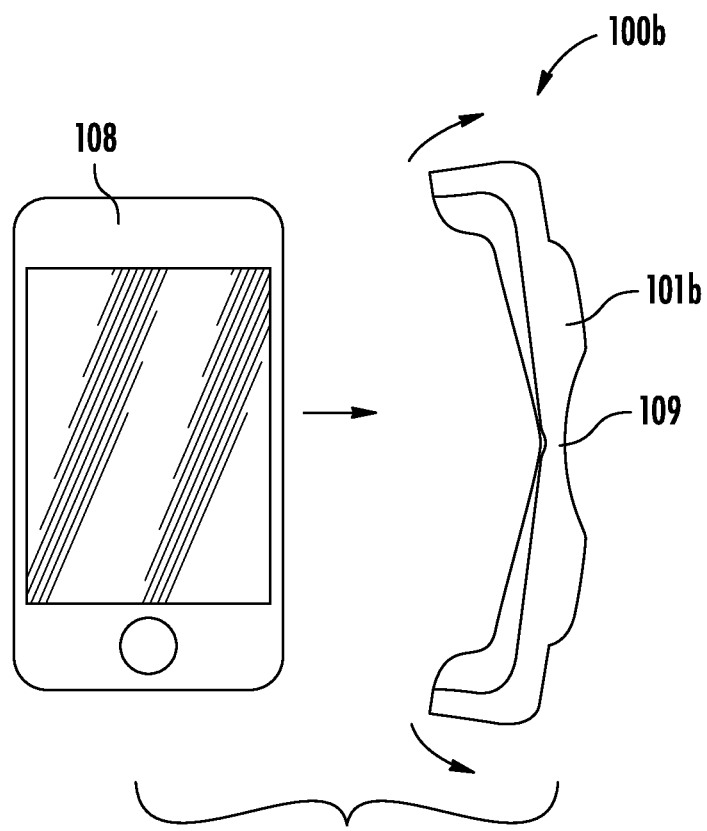
FIG. 3E illustrates a fourth embodiment of the ergonomic accessory which employs a slight camber to provide purchase with the PED.

FIGS. 3D and 3E depict the ways in which the ergonomic accessory 100 is designed so as to have a purchase on a PED 108.

In FIG. 3D, the liner element 102 is comprised of urethane, or a urethane-like flexible plastic material, having a sticky surface. Liner element 102 is shaped and sized so as to serve as an inner liner to the ergonomic accessory body 101. Element 102 is inserted into the inside of the ergonomic accessory is body 101 as suggested by the arrow in FIG. 3D. The outer surfaces of liner element 102 is glued where it comes into contact with the inner surfaces of accessory body 101. Liner element 102 comprises a very thin layer. When the ergonomic accessory 100, so lined with element 102, is coupled to a PED 108, the liner 102/accessory body 101 couplet is dimensioned such that the liner 102 will be slightly compressed. As such, the ergonomic accessory 100 exerts a gripping force against the surfaces of the PED 108 to which the accessory 100 and liner 102 comes into contact. This gripping action created by the compressed, sticky liner element 102 will help ensure that the PED 108 will not escape from the hold of the ergonomic accessory 100 under normal usage. This means in turn that a firm tethering of the PED 108 to the digit(s)/hand of the user will be ensured vis a vis the ergonomic accessory 100 as so designed.

In furtherance of the need to ensure that the ergonomic accessory 100 will have a sufficiently tight hold on the PED 108, the accessory 100*b* may optionally be fabricated so as to have a slight camber, shown somewhat exaggerated in the view of the fourth embodiment provided in FIG. 3E. When the PED 108 is fitted into the ergonomic accessory 100*b*, the camber on the accessory 100*b* will be relieved. The action, in which the ergonomic accessory will assume a straight-line, rather than bent or cambered, shape so as to conform to the straight edge of the PED 108, will provide a clamping effect which will further the hold of the ergonomic accessory 100*b* upon the PED 108. This clamping effect and these gripping forces will be exerted upon the PED 108 by the inside surfaces of the accessory 100*b* along both its short top and bottom (i.e., lateral) extensions caused by the rotational stress upon the vertical axis of the ergonomic accessory 100*b* as it wishes to return to its originally fabricated cambered shape.

Figure 3F:
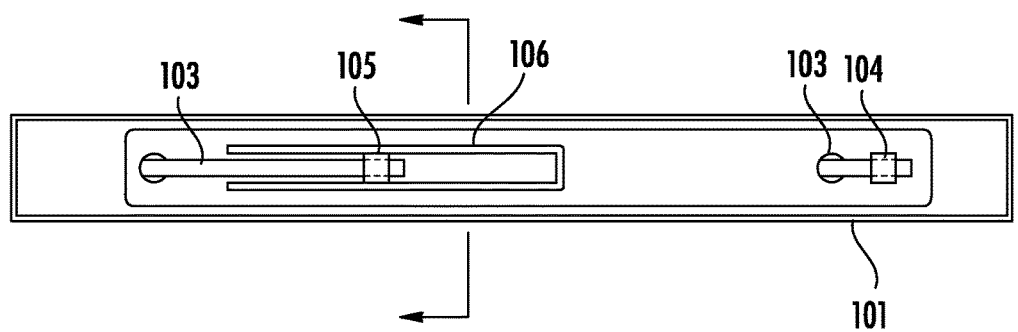
FIG. 3F is an inside elevation view of the second embodiment of the invention.

FIG. 3F is an elevation view of the inside surface of the body element 101 of the ergonomic accessory 100. This shows the left-most end of the tether element 103 being bound to the body element 101 by a "stop" element 104 having a hole through which the tether element 103 is threaded. This end of the tether element 103 is enlarged such that it remains in connection with stop element 104. The stop element 104 is not physically integrated into, or otherwise adhered to, the body element 101. This stop element 104 is large enough such that it cannot be pulled through the opening in the body element 101 through which the tether has been inserted.

The inside view of the ergonomic accessory 100 body element 101 provided by FIG. 3F also shows the means by which the second, or right-most, end of the tether is connected to the accessory. This end of the tether element 103 is likewise threaded through a second stop element 105. This stop element 105 is sized to fit snugly into a channel element 106 which is integral to the body element 101 of the ergonomic accessory 100. This channel element 106 acts as a friction slide which enables the tether element 103 to be adjusted in length to accommodate differing preferences in respect of elastic tension. Changing the length dimension of the tether element 103 allows for the variations in digit dimensions, number of digit(s) chosen to be enveloped by the tether element 103, and for personal preferences with respect to the actual tightness and force of the tether acting against the digits. Changing the length of tether element 103, and thus its degree of elastic tension, will determine whether the PED 108 feels more or less secure in its attachment to the digits/hand, and it will have an effect upon the degree of maneuverability of the digits as they are pressed against the rear surface of the PED 108.

Figure 3G:
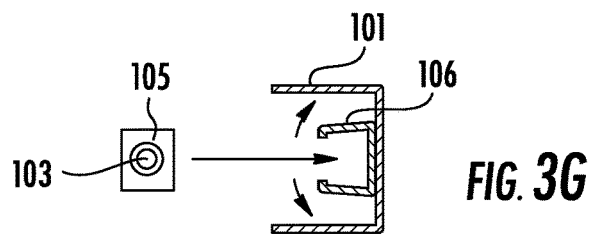
FIG. 3G is an exploded end section view of FIG. 3F.
Figure 3H:
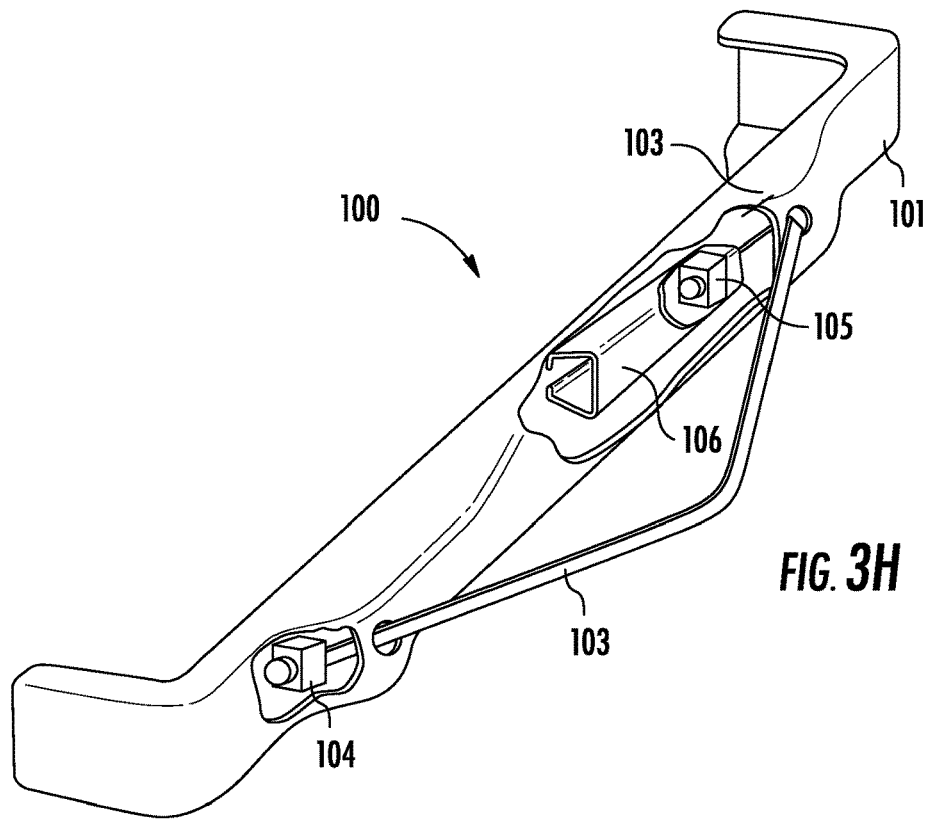
FIG. 3H is a cut-away perspective of FIG. 3D.

FIG. 3G is a cross-sectional view of the channel element 106. This view shows that the side edges of the channel element 106 are slightly cambered to the extent that when the tether element 103 stop element 105 is inserted and then moved along the channel element 106, the channel element's sides become "sprung." This action produces a force, and thus the greater degree of friction, necessary for the stop element 105 to remain in its selected position within the channel element 106 so as to maintain the desired tether element 103 length as it has been preferentially positioned. The slide element 105 can be reached and manually moved back and forth within the channel element 106 before clipping the ergonomic accessory 100 to a PED 108. FIG. 3H is a perspective view, with cutaways, to further illustrate these component features to the ergonomic accessory 100 as herein described.

FIGS. 4A-4G generally show how the ergonomic accessory 100 can be used, coupling the hand to a PED 108 by way of the positioning and action of the tether element 103. These views show that two digits have been inserted and enwrapped by the tether element 103 to varying degrees. The number of digits so inserted, and the extent to which they have been inserted are variables that are matters of personal comfort, and the need for greater or lesser security in the coupling of PED to hand. The manner and extent to which the digits are inserted within the envelope of the ergonomic tether element 103 more importantly yet will determine the extent to which the PED 108 is operated in an ergonomically efficient and effective way.

Figure 4A:
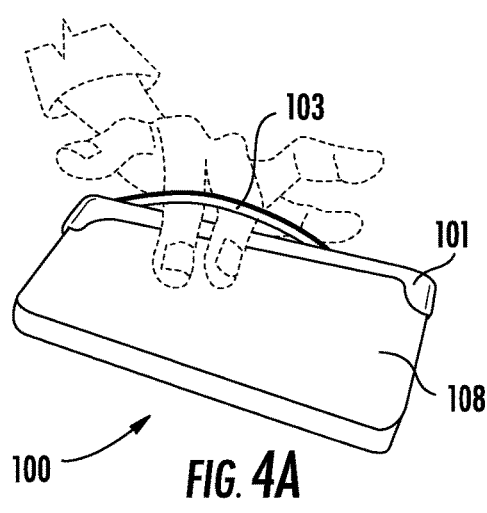
FIGS. 4A-4G illustrate various views of the second embodiment of the invention in actual usage.

FIG. 4A specifically provides a view looking upward toward the coupled PED 108 and ergonomic accessory 100 as they are suspended from a downward-pointing arm. This view illustrates the "pinching" action of the tether element 103 clamping the fingers against the rear of the PED 108.

Frictional forces between the skin of the digits and the tether element 103, and between the skin of the clamped digits and the rear surface of the PED 108, prevent the PED 108 from falling out of the hand to the ground.

Figure 4B:
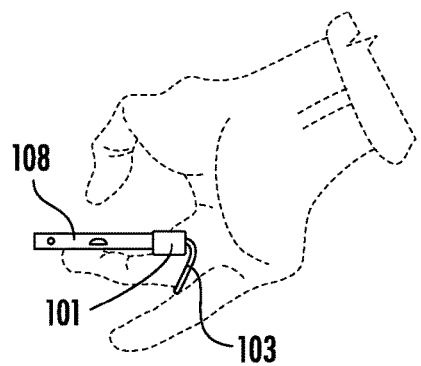

FIG. 4B provides a view looking toward the bottom edge of a PED 108 when in use. This view provides one perspective on how the tether element 103 envelopes the digits in a way that prevents the PED 108, in the manner of its conventional usage, from sliding off of the fingers and out of the hand. This view also suggests that even when the digits are inserted only part way, say, only to the first joint of the digits, the tether element 103 will prevent the PED 108 from "flipping," or rotating out of the hand counterclockwise under the effects of gravity. This view also shows how the palm of the hand may be rotated to the vertical position, however far the digits may be inserted beneath the tether element 103, such that the thumb can be positioned to reach all areas of the PED 108 screen.

Figure 4C:
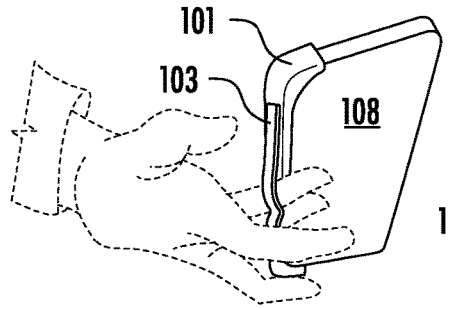

FIG. 4C provides a view facing the rear of the PED 108. It shows the digits rather minimally inserted beneath the tether element 103. The positioning of the PED 108 continues to be stabilized by the clamping effect of the tether element heretofore mentioned, such that the PED 108 cannot slide off of or rotate away from the digits and hand.

Figure 4D:
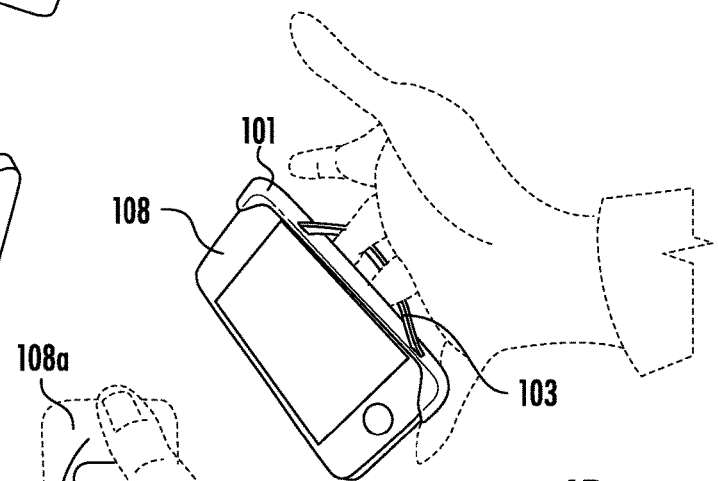

FIG. 4D, alternatively, provides a view as if the user is looking down toward the PED 108 as it attaches to the digits by way of the ergonomic accessory 100. This view shows clearly the physical grasping "envelope" provided by the tether element 103 as it surrounds the digits chosen to be inserted therein.

Figure 4E:
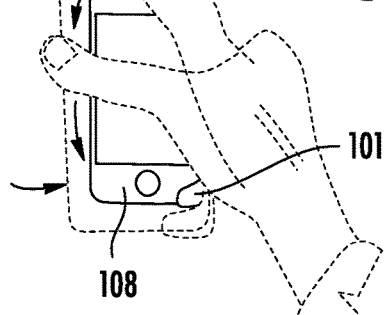

FIG. 4E provides another view as if the user is looking downward toward a PED when in use. This figure shows how the thumb, when the palm of the hand is enabled to be brought to the vertical position (without loss of a hold on, or control of, a PED) through use and benefit of the ergonomic accessory 100, can reach all far and near extremes of the screen area of a conventionally-sized PED 108 without undue stress on the thumb joints. This figure also shows how this is the case even for a "phablet" 108b, shown in dotted lines, whose screen size, and thus those ergonomic "strain zones," are, by definition, much larger.

Figure 4F:
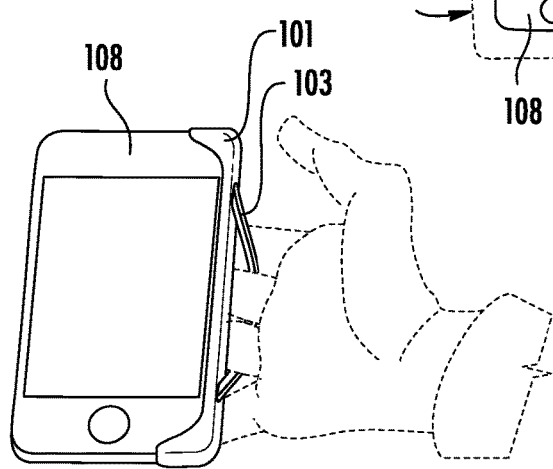

FIG. 4F provides a view from the user's perspective similar to FIG. 4E, except that the palm of the hand has been rotated clockwise away from the PED to a more-horizontal inclination, thus exposing the inside of the digits, the tether element 103 and the PED 108 to full observation.

Figure 4G:
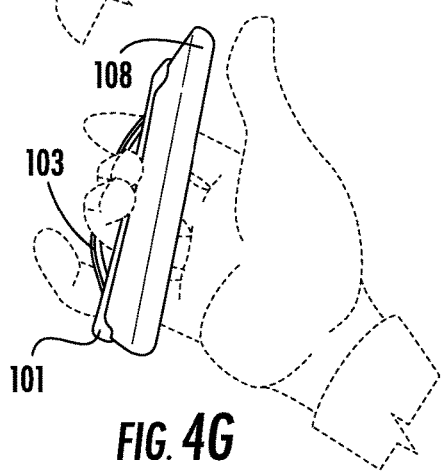

FIG. 4G on the other hand, provides a nearly identical perspective as FIG. 4F. In this case, however, the two digits enveloped by the ergonomic tether element 103 have been curled, flipping the PEP 108 such that the outside surface of the digits and the rear of the PED 108 have been exposed.

Figure 5:
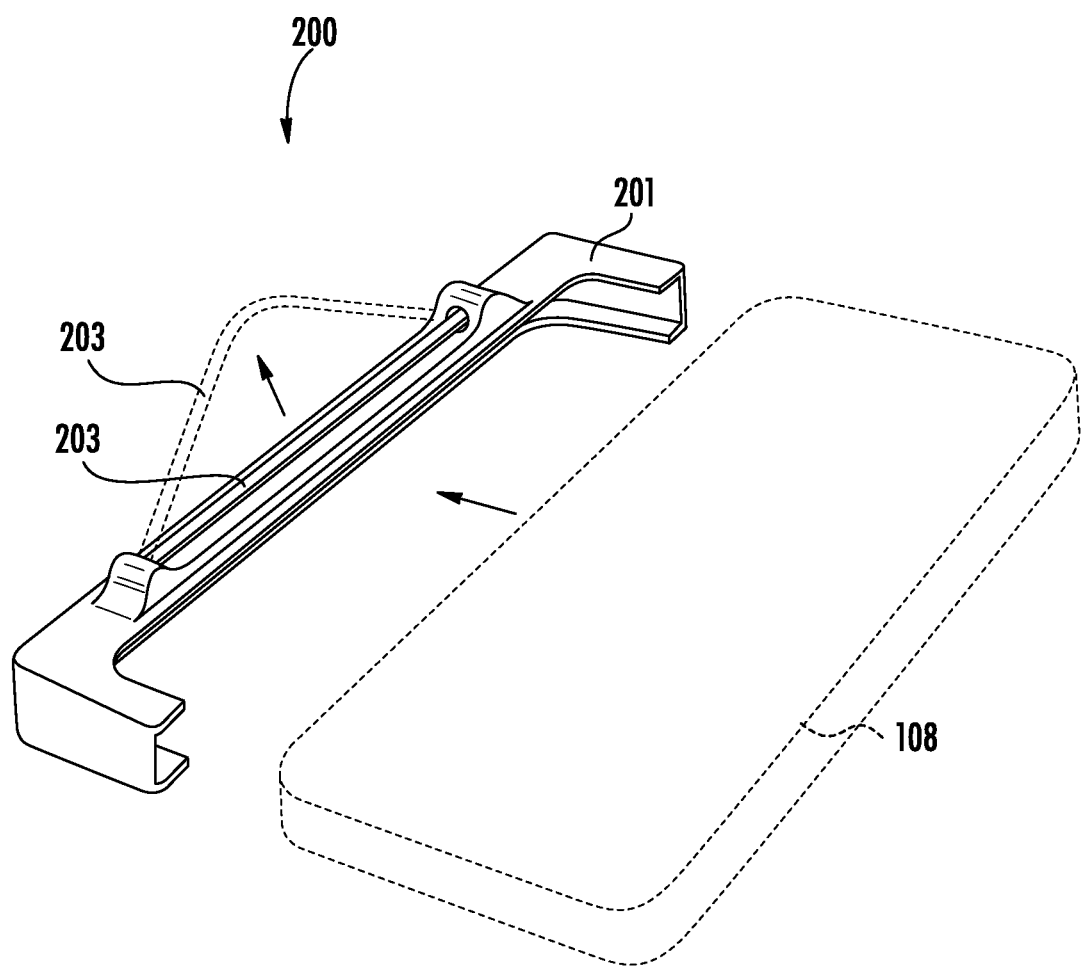
FIG. 5 is a perspective view of a fifth embodiment of the ergonomic accessory.

FIG. 5 is a perspective view of a fifth embodiment 200 of the invention. In this embodiment, the tether element 203 is mounted at the rear face of the body element 201. The adjustable tether element 103 is depicted in both its resting as well as, in dotted lines, its stretched positions. The drawing shows the rear face of a PED 108 and, as the arrow suggests, how it is to be slid and thus clipped into the ergonomic accessory 200.

FIGS. 6A-6G provide several views depicting how the hand of the user is joined to the PED 108 via the alternative embodiment of the ergonomic accessory which employs a rear-mounted tether element 203. The tether element 203 is positioned at the extreme edge of the PED 108 proximate to the palm of the user's hand when the body element 201 of the ergonomic accessory 200 is clipped to the PED 108. This near-hand positioning of the rear-mounted tether element 203 is critical in that, as with the side-mounted tether, it allows the palm of the hand to be rotated counterclockwise (when the PED is in the right hand of the user) so as to be positioned fully over the top of the PED 108 screen, such that all screen areas can be reached without ergonomic strain to the thumb and with the wrist maintained in a more natural "untwisted" position. Fundamentally, all that has been said above in respect of the configuration design, and ergonomic purposes and functionality of the ergonomic accessories 100, 100a and 100b is equally applicable to this alternate embodiment of the accessory 200, the difference only being the location of the points of connection of the tether element at the rear of the accessory's body 201 rather than at its side edge.

FIG. 6A is a view from below, showing the PED 108 coupled to the ergonomic accessory 200 as these elements, joined to the digits of the hand by the clasping action of the tether element, dangle securely without risk of being dropped. This is the case even when the digits are only minimally inserted within the envelope of the tether element 203 as is shown in this view FIG. 6B shows the hand of a PED 108 as if being viewed from above by the user. This view suggests how easy it is to rotate the palm of the hand and bring it and the thumb well over the top of the screen surface of the PED 198, thus allowing the thumb to be in a position to manipulate all regions of the screen without strain or awkward positioning. Note too how the wrist is aligned in a more neutral position, straight and without a twist or unnatural strain.

FIG. 6C provides another view from a lower-level perspective that shows how the tether element 203 prevents the PED 108 from rotating clockwise out of the hand under the effects of gravity, this being the case even when, as illustrated, the digits are only very partially inserted beneath the tether element 203.

FIG. 6D comprises a view from the top, with the palm of the hand held perpendicular to the ground so as to dangle the PED 108. The clamping effect on the digits provided by the elastic tether element 203, coupled with the correlative frictional forces of the skin surface of the digits against the tether element 203 and the rear surface of the PED 108, prevent the PED 108 from sliding to the ground.

FIG. 6E shows that when in use, only the stylized body element 201 of the ergonomic accessory 200, and not the rear-mounted tether element 203, is visible to the user. This view again shows as well, how the PED 108 may be both kept secure, controlled and used with the digits being only very slightly inserted within the bounds of the rear tether element 203.

With the palm of the hand rotated clockwise to the horizontal, FIG. 6F brings into view the rear-mounted element 203 in the manner of its typical use.

FIG. 6G brings the rear of the PED 108 into view by a curling action of the digits inserted beneath the tether element 203 such that the PED 108 can be grabbed and held tightly by hooking the thumb over its top edge, should this be desired.

Figure 7A:
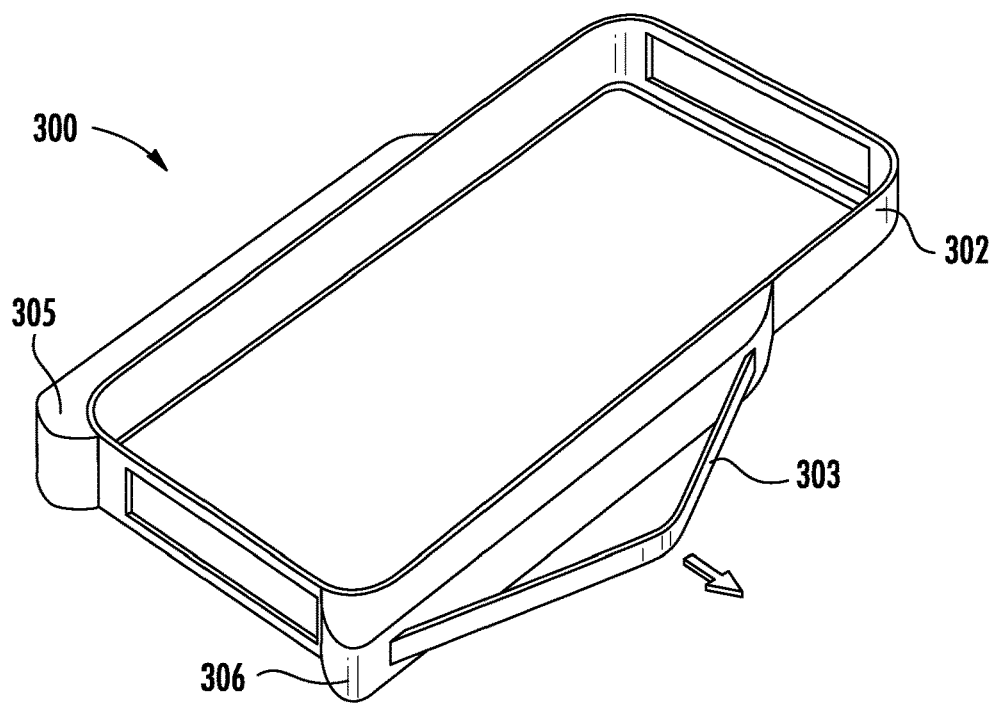
FIG. 7A is a perspective view of a sixth embodiment of the ergonomic accessory.
Figure 7B:
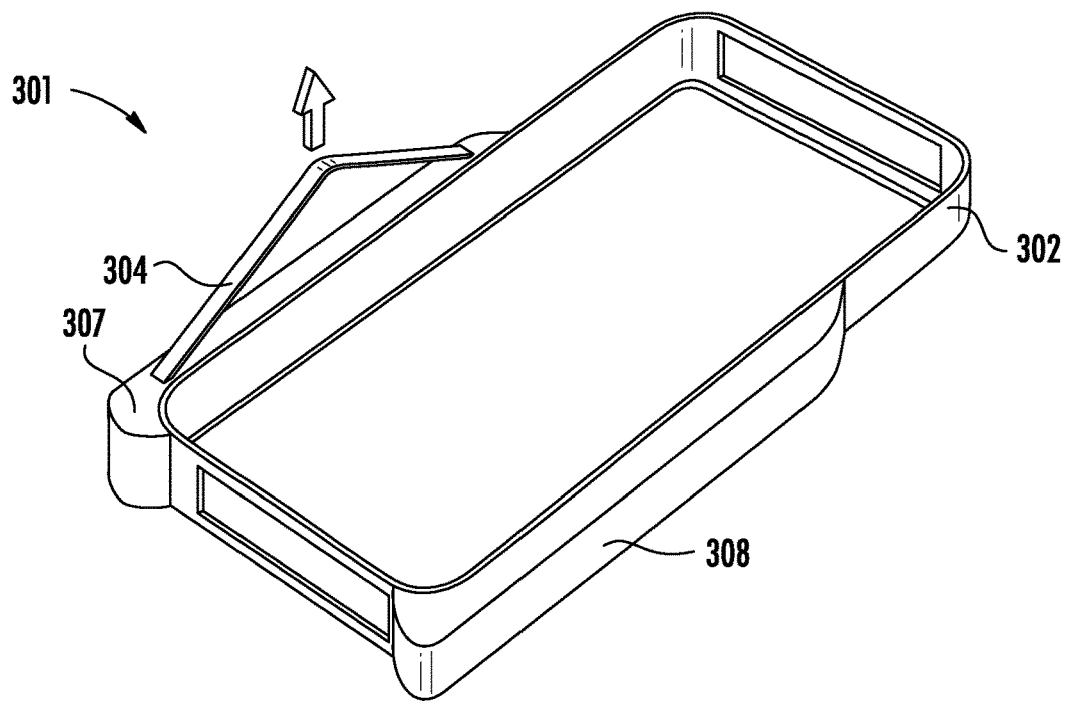
FIG. 7B is a perspective view of a seventh embodiment of the ergonomic accessory.

FIGS. 7A and 7B show how alternate embodiments of the ergonomic accessory, the sixth embodiment 300 and the seventh embodiment 301 may comprise both side-edge ergonomic cushion elements along with, respectively, a side-mounted tether element 303 and a rear-mounted tether element 304. These ergonomic cushion and tether elements are shown to be collectively contained within the design of a typical bumper-like PED case 302, the bumpers being designated by the reference 305, 306, 307 and 308. Such combining of these elements, as they have been heretofore described in their individual manifestations, would maximize the ergonomic benefits afforded to the user of a PED. The arrows are provided to illustrate the directions of extension of tethers 303 and 304.

Figure 8:
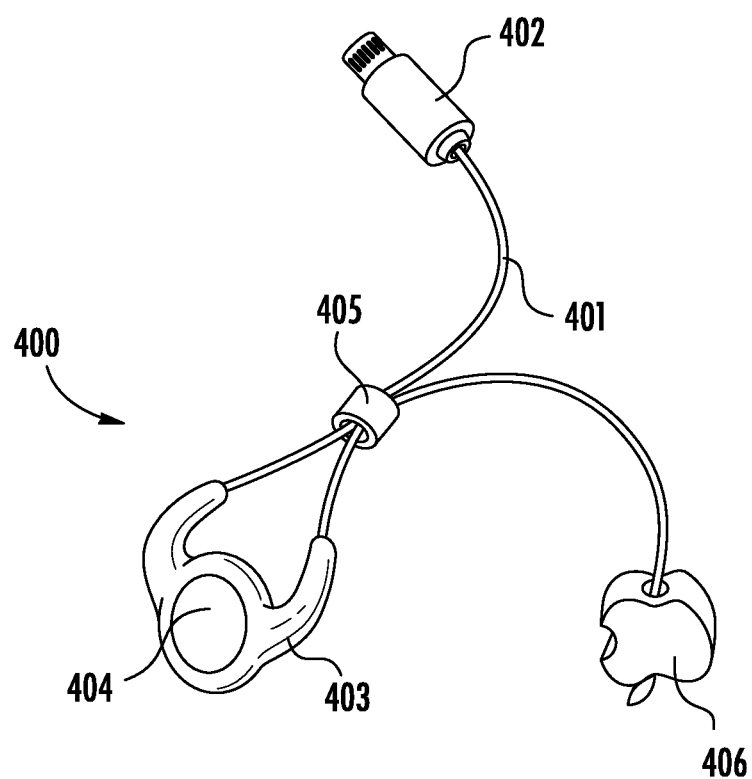
FIG. 8 is a perspective view of an eighth embodiment of the ergonomic accessory.

Referring to FIG. 8, this eighth embodiment 400 of the ergonomic accessory employs a cord element 401, which is attached in various manners to a PED at one end, and to the digit(s) of the hand at its intermediate looped dimension. The ergonomic accessory 400 is comprised of various elements, including the cord element 401; a cord-to-PED connector 402 at a first end of the cord element 401; a ring element 403; a ring face element 404; an adjustable slide element 405 and interchangeably, as desired, a decorative ornament or tassel, item of jewelry, or technological component attached at a second end of the cord 401 as element 406.

Figure 9:
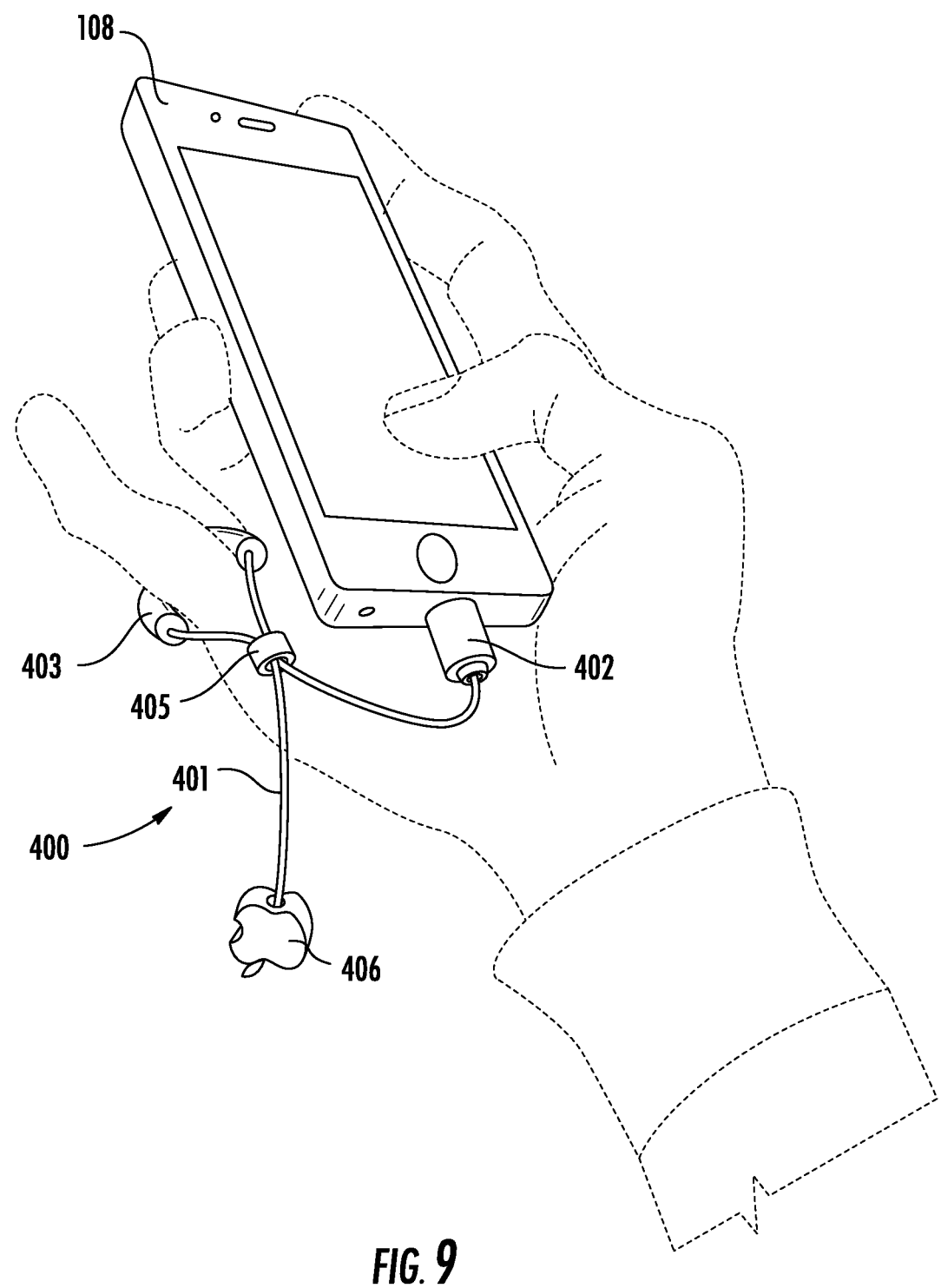
FIG. 9 is a perspective view of the eighth embodiment of the invention connecting a finger with a PED.

The essential function of this embodiment 400 is to connect, in a wearable manner, a hand-held PED, such as a standard cellphone or smartphone, to the body, and in particular to the digit(s) of the hand of the user of the device such that its ergonomic benefits may obtain. The manner in which this connection and utilization so described is to be achieved is illustrated in FIG. 9, with PED and human hand shown. Through this means of use and connection all the ergonomic attributes herein formerly described will be manifested to the full benefit of the user. The connection of the ergonomic accessory 400 is designed to be made to any digit or combination of digits of the hand as a matter of individual choice so as to optimize its ergonomic utility and to enhance the utilization of the PED. So conjoined to the digit(s)/hand, the user, through employment of this eighth embodiment of the accessory of the invention, operate the PED with the thumb of the hand to which it is tethered while maintaining a secure hold on the PED in a manner which allows for actuation of the accessory's ergonomic benefits.

Apart from its intended primary ergonomic functionality, this embodiment 400 can serve as a physical platform upon which ornamental elements of fashion or jewelry, may be appended. It may also serve as a platform upon which various manner of electronic technological elements may, as aspects of "wearable technology," be appended in a way and at locations which will be described below with reference to the accessory's various constituent elements. Correlative non-ergonomic benefits provided by the accessory of the invention 400 and those unrelated to aspects of fashion or technology, such as protection against dropping a PED or helping prevent inadvertent loss of the PED, are numerous but will not be discussed in detail herein to the extent that these benefits are secondary to the accessory's primary ergonomic functionality. Such benefits will be apparent to those having skill in the art based upon the disclosures herein.

Referring to FIG. 8, the cord element 401 provides the physical linkage between the PED and the digit(s) of the user. The cord may be made of any flexible material, including but not limited to plastic, fabric, or metal, and it may be elastic or non-elastic in nature. Where electronic technological elements are incorporated into this embodiment 400, the cord element 401 may, as necessary so as to transmit electrical current or digital or other information or signals to the PED, be comprised of flexible electrical cord or wire. At one end, the cord 401 may be connected to the PED directly through use of a simple suitable connector element 402 inserted into an affixation element of the PED such as the charge port or the earphone port of the device. The cord element 401 may also be connected to the PED indirectly at this end through a technological component such as an external rechargeable battery pack. At the far extreme of the cord element 401 on the other hand, an ornamental tassel, or pendant, or other item or fashion or jewelry, or technological component (collectively, element 406) of any design or functionality ma be appended to the cord element 401. At the approximate mid-point in the length of the cord element 401, a "loop" (element 401b as per FIG. 10) will be created through use of an adjustable slide element 405. This loop element 401b is intended to slide over and around one or more digits of the hand to form a "fingerlet" of sorts. Enveloping the loop element 401b partially, and serving the function of creating a fingerlet at this location, a ring or ring-like element 403 may be employed as a decorative element (or, as will be later described, as a possible technological component). A decorative ring face element 404, separable as an element, or conjoined permanently to the ring element 403, may be a further feature of this embodiment of the ergonomic accessory 400.

Figure 10:
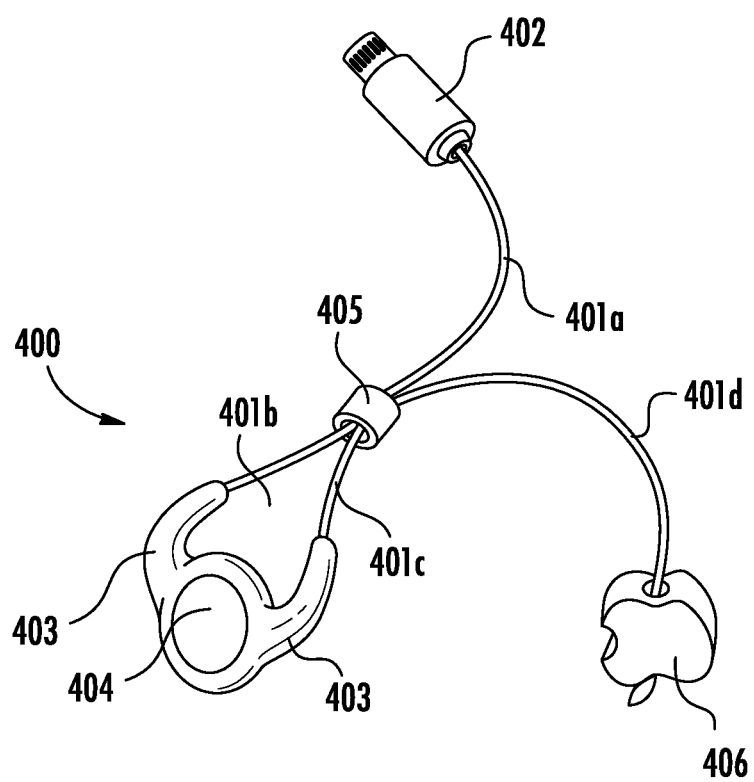
FIG. 10 illustrates the use of adjustable elements of the eighth embodiment of the invention.

Referencing FIG. 10, the cord element through use of the slide element 405, is adjustable in two critical dimensions to account for individual hand sizes, finger dimensions, and individual preference as to the number and identity of the digits chosen to be enveloped by the fingerlet loop element 401b. This enables the cord to be adjusted to account for personal preferences in terms of the "feel" of the accessory of the invention 400 and how it may be optimally utilized for its ergonomic purposes and to enhance the efficiency of PED utilization. In short, the slide element 405, coupled with the ability of the ring element 403 to slide along the cord element, provides for a one-size-fits-all ergonomic accessory 400.

Specifically, when the fingerlet loop 401b/ring 403 elements are grasped, the slide element 405 may be held between the fingers and pulled in the direction away from the loop element 401b. This will have the effect of shortening the tether segment 401a. If, on the other hand, the connector element 402 is grasped, pulling the slide 405 in the direction away from the connector element 402 will have the reverse effect in lengthening cord segment 401a. This adjustment will determine where the PED resides comfortably in the hand, thus accounting for individual variation in hand sizes.

Once this adjustment is made, the tether fingerlet loop element 401b may be adjusted in circumferential dimension to account for preferences in terms of the specific digits wished to be enveloped by the loop element, and finger size. To do this, the user will grasp cord segment 401c (while holding the slide element 405) and pull it to increase fingerlet loop element 401b size (or circumference). Grasping the slide element 405, and pulling on cord segment 401d, on the other hand, will reduce in circumference and size, the loop element 401b's dimension.

Lastly, and once the desired loop element 401b's size has been configured per the above procedure, the ring element 403 (since it too, as an independent physical element, slides freely along the cord element in either direction, rather than being fixed to the cord in a permanent way) can be moved to the "apex" of the loop element 401b positionally (i.e., that point on the loop element 401b furthest from slide element 405) to comfortably rest on the digit or digits enveloped by the fingerlet loop element 401b.

Depending on how long or short the length of cord segment 401a is adjusted to, and depending on the loop element 401b dimension desired, the tether element in remaining segmental length 401d will vary, being shorter or longer. The result of these adjustments will determine how far from the hand the decorative or technological element 406 will fall from the hand.

Having made all the dimensional adjustments described above, use of this embodiment of the present invention simply involves insertion of the preferred digit(s) through loop element 401b before, or after, connecting to the PED by way of connector element 402.

Figure 11:
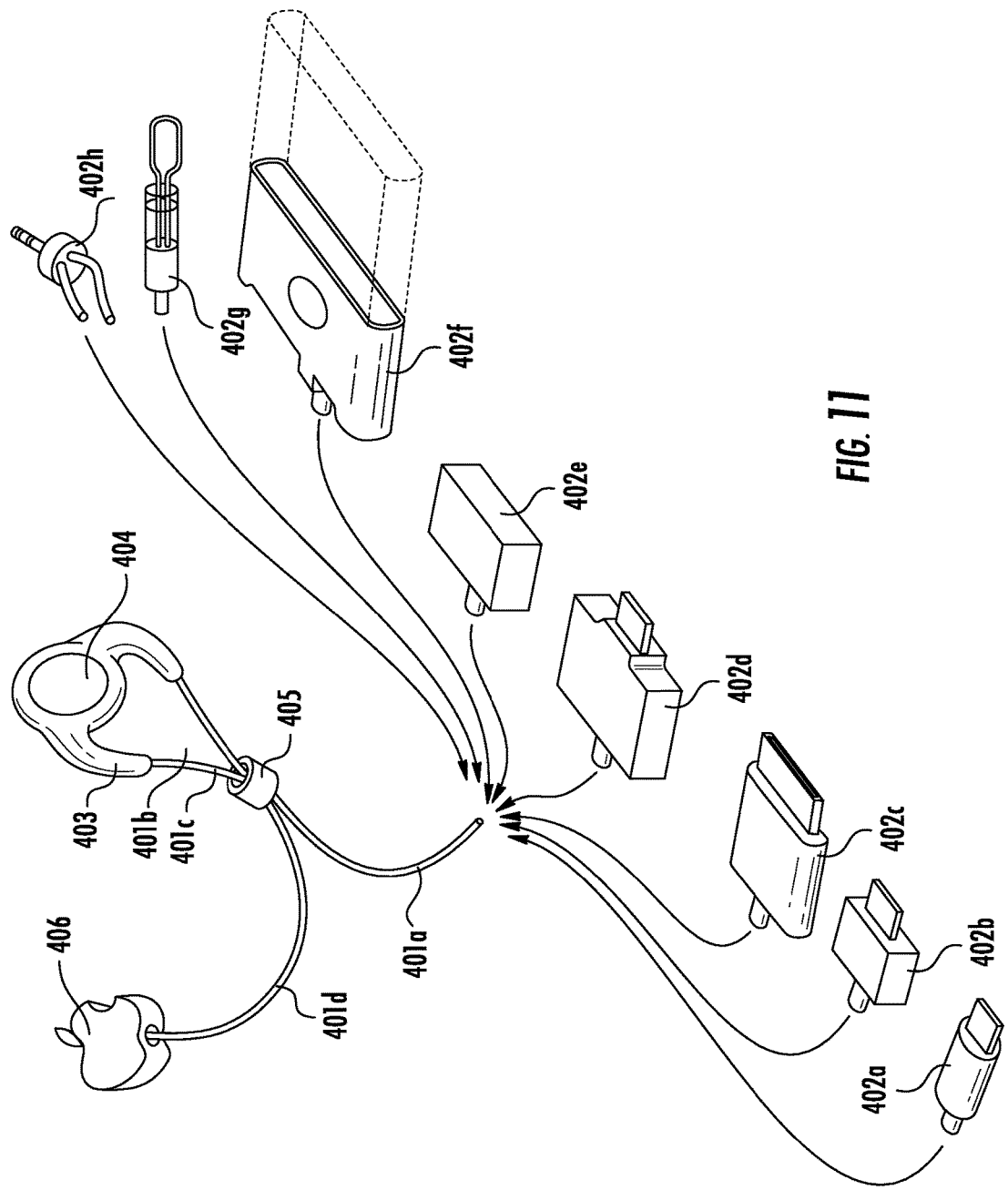
FIG. 11 illustrates various decorative and technological elements that may be appended to the eighth embodiment of the invention.

The cord-to-PED connector element 402 (see FIG. 9), in various of its possible manifestations, is shown in FIG. 11. In one embodiment, the cord element, through segment 401a may be joined to a component connector element that is exact in size to an Apple "Lightning" element 402a, Apple 30-pin element 402c, or Micro-USB element 402b charge connector, thus enabling connection of the ergonomic accessory 400 directly to a PED via its charge port. Alternatively, the cord element may be connected indirectly to a PED into and through an external rechargeable battery pack 402d serving as a technological component. All manner of other technological component elements 402e through which the cord element may be connected to the PED indirectly may be imagined to be placed at this location as well. This connection of cord element may also be facilitated through use of a partial case-like element 402f which grasps the PED securely and to which the cord element is attached through a permanent or quick-disconnect arrangement. A connector element 402g designed to couple to the pop-up pin of an Apple iPod may alternatively be employed. As a further example, the cord element may be indirectly connectable to a PED, through incorporation into an ear phone jack assembly element 402h.

Figure 12A:
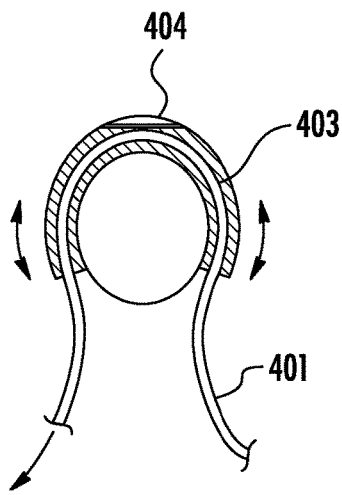
FIG. 12A-12C are provided to illustrate alternate ring designs that can be used with the eighth embodiment of the invention.
Figure 12B:
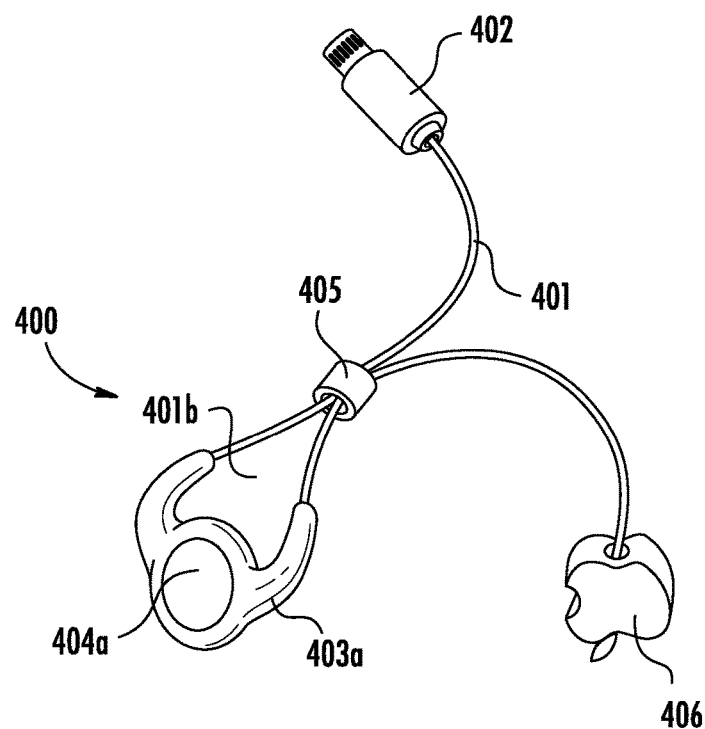
Figure 12C:
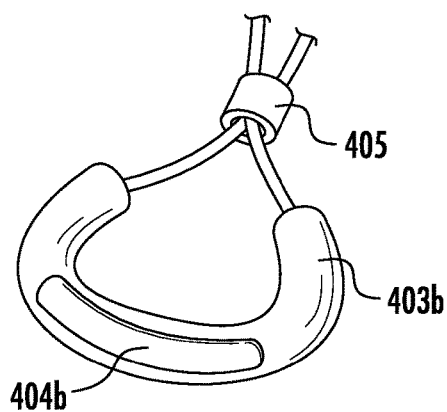

The ring element 403, and the ring face element 404, in two exemplary manifestations in terms of design, are illustrated in FIGS. 12A-12C. Ring element 403a is intended to be of a more traditional ring shape and design. Ring element 403b is shown simply in a tubular shape through whose body, in a tunnel arrangement, the cord element 401 runs. The cross sectional view FIG. 12A, illustrates how this tunnel concept is configured such that the ring body element 403, however it may be designed, envelopes the cord element 401 in a loose way that permits the ring to travel, in slidable engagement, along the cord so as to make the adjustments in dimensions for the accessory of the invention 400 such that personal hand and digit dimensions can be accommodated as previously described. The ring element 403 is only partially circumferential in terms of surrounding the digit(s). When coupled to the cord element 401, as it is formed into a loop element 401b, the ring/tether composite structure will be fully circumferential to the digit(s), thus securing the PED to the hand. The adjustments to the lengths of the various cord element 401 segments, previously elaborated on, provides for the variation in the degree of snugness of the cord loop element 401b. The ring 403 is flexible in construction and material selection so that its flexibly follows the circumferential dimension of the digit(s) of the user as the cord loop element 401b is adjusted in size.

When the ergonomic accessory of the invention 400 is worn, the user appears to be wearing a conventional ring, optionally a decorative ring or item of jewelry and fashion, rather than simply having a bare tether wrapped as a loop around the digit(s). Adding to this concept of the ring element 403 serving as an item of fashion, a ring face element 404 of various designs, such as 404a and 404b, may be incorporated into the ring by permanent attachment or as a removable (e.g., snap-on/snap-off) interchangeable element. The ring face may be made of any material, may be of any possible design and appearance, and may be etched or otherwise provided with a name, slogan, or any other written design or logo concept.

Alternatively, the ring element 403, or the ring element 403/ring face element 404 complex, rather than serving as a fashion element, may comprise a technologic element connecting wirelessly to a PED.

Figure 13:
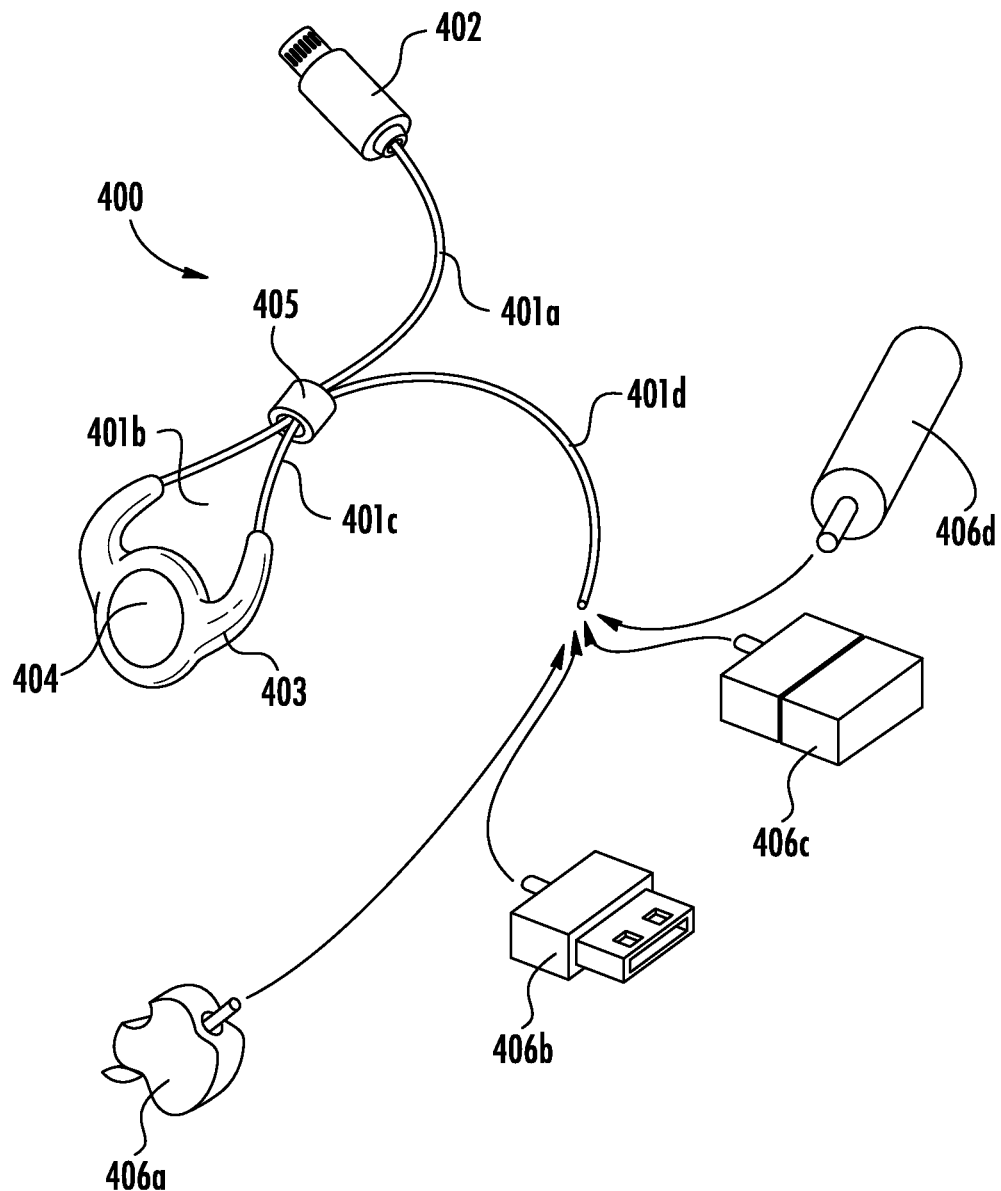
FIG. 13 illustrates various additional elements that may be appended to the eighth embodiment of the invention.

FIG. 13 illustrates certain and various functional elements of the ergonomic accessory of the present invention 400 appended to the cord element at its segmental 401d end. This is the end of the cord element located furthest from the cord element segment 401a which connects, to a PED by way of a cord connection element 402. Such functional elements may include an ornamental tassel or pendant, or other item of fashion or jewelry 406a. When the ergonomic accessory of the present invention is affixed to the hand via the fingerlet loop element 401b, exemplary decorative/technological elements 406a-406d in their various possible decorative or technological manifestations, will hang suspended from the hand. The decorative/technological elements, as illustrated in FIG. 13, may also be comprised of technological components including, but not limited to, connector elements 406b, flash drive elements 406c, or external rechargeable battery pack elements 406d. To the extent that technological elements may be appended at this end of the cord element, the cord itself may need to be comprised of a flexible electrical cable capable of carrying electrical current, digital signals or other information or signals to and from a PED.

Figure 14:
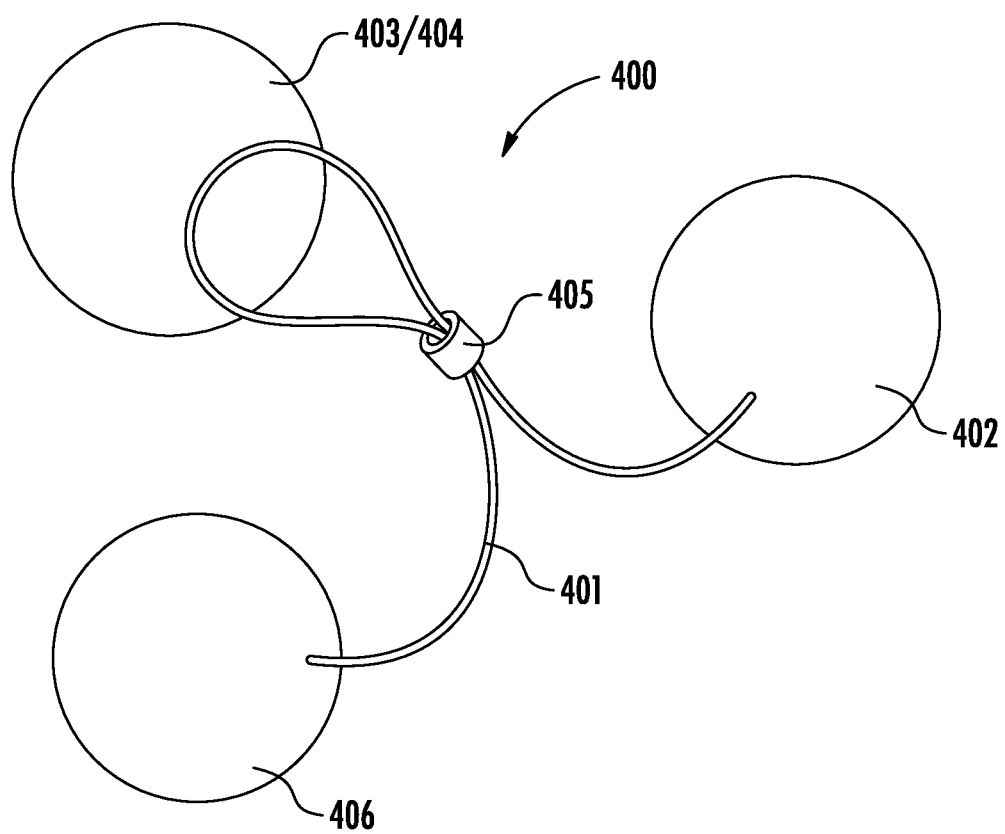
FIG. 14 illustrates the locations where items of wearable technology and PED peripherals may be placed on the eighth embodiment of the invention.

FIG. 14, in an illustrative way, identifies the several loci 402, 403/404 and 406, for technological elements incorporated into or otherwise appended to, the ergonomic accessory of the present invention 400 which, in this respect, serves as a general platform for wearable technology.

In a ninth embodiment, ergonomic accessory 500 is illustrated in FIGS. 15A, B and C as it would appear prior to its affixation to a PED. FIG. 15A is a plan elevation, FIG. 15B is a bottom end elevation and FIG. 15C is a side elevation. Ergonomic accessory 500 is generally comprised of a base layer 501, a backing layer 510 and a pocket 504. In a preferred embodiment the base layer 501, backing layer 510 and pocket 504 can be made of a single piece of adhesive backed material.

Base layer 501 comprises a plastic film underlayment over which screen protector 507 (see also FIGS. 16-18) is affixed. Screen protector 507 may be comprised of plastic or glass. Openings 502 and 503 are provided to allow access to PED control buttons and it is understood that these as well as additional openings can be provided in whatever locations are required for a particular PED. The pocket 504, also referred to as a blister pocket, secures the buttress 505 within the ergonomic accessory and receives tether 506. Referring to FIGS. 19A, C and D, openings 512 and 513 are provided in pocket 504 and these openings line up with openings 514 and 515 in buttress 505 when the buttress is received in the pocket. The openings receive ends A and B of tether 506 and the tether is secured therein to the ergonomic accessory 500 by adhesive or other suitable means.

Figure 16:
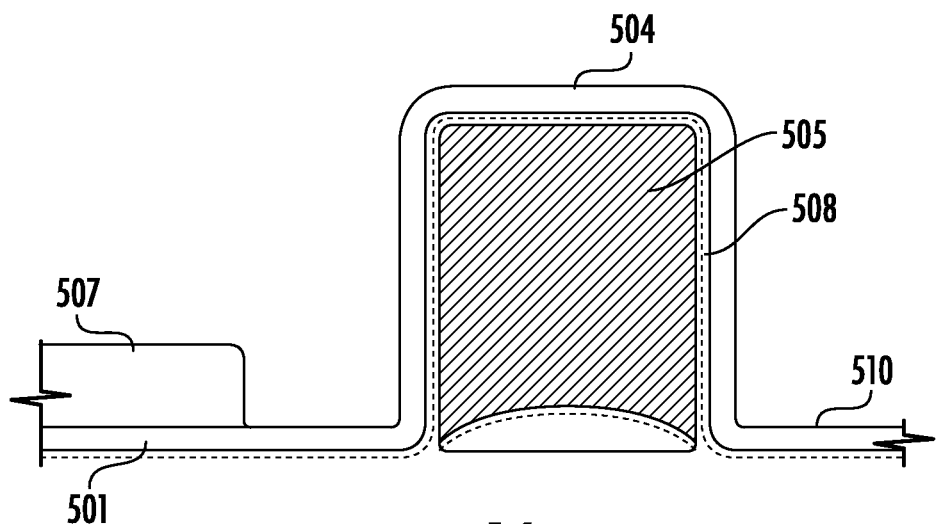
FIG. 16 illustrates pocket 504 in a section taken along section line A-A of FIG. 15A.
Figure 18:
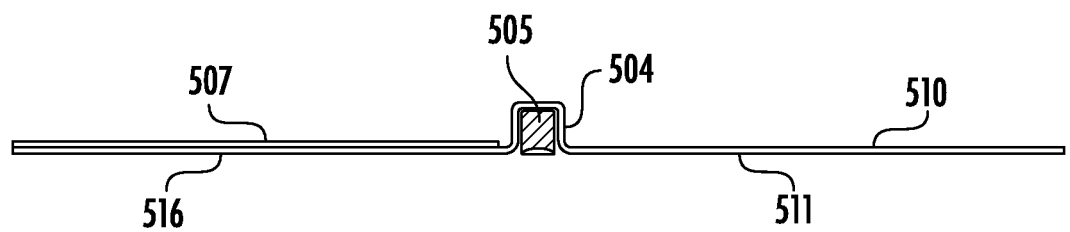
FIG. 18 is a section view taken along section line A-A of FIG. 15A.
Figure 19:
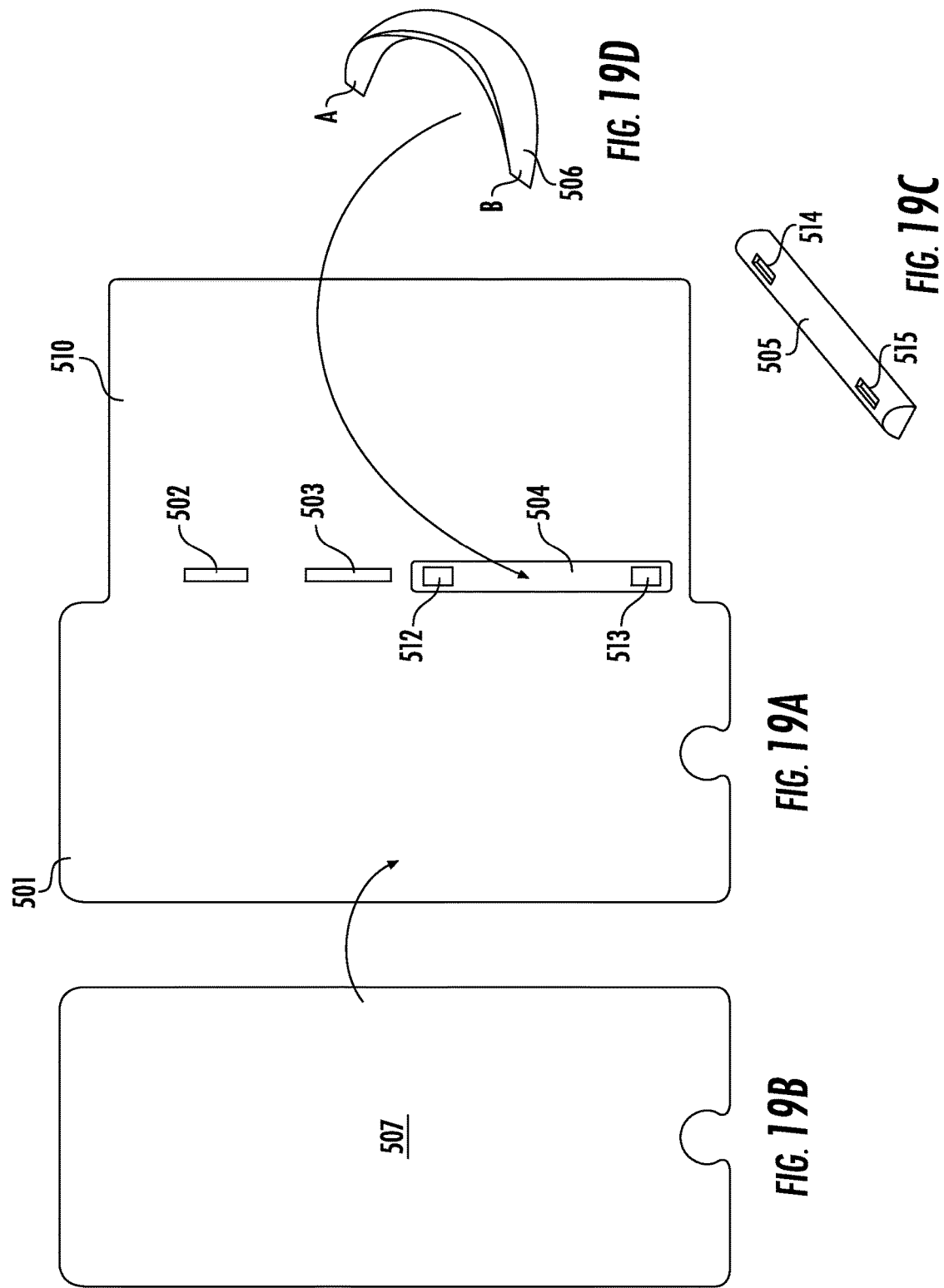
FIGS. 19A, C and D illustrate the components of the ninth embodiment of the ergonomic accessory before assembly.
FIG. 19B is an elevation view of a screen saver.

FIG. 18 is a section view taken along section line A-A in FIG. 15A and FIG. 16 is an enlarged view of the encircled portion of FIG. 18. Adhesive backing 508 secures the buttress 505 within pocket 504 and the same or similar adhesive backing is provided on the underside 511 of backing layer 510 and on the underside 516 of base layer 501. As noted above, base layer 501, pocket 504 and backing layer 510 can be made of one unitary piece of material which is adhesive backed.

Figure 17:
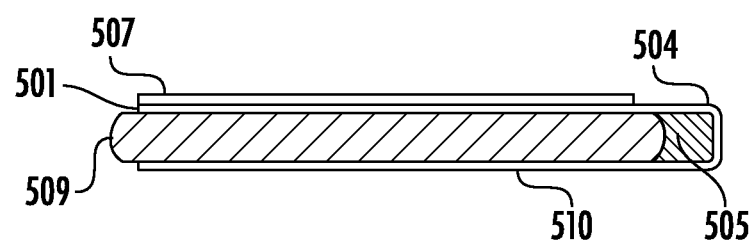
FIG. 17 is a section view of the ergonomic accessory of the ninth embodiment which has been installed on a PED.

PED 509 is illustrated in FIG. 17 wherein the ergonomic accessory 500 has been affixed thereto. Base layer 501 is adhered to the screen side of the PED and backing layer 510 is adhered to the back of the PED.

FIGS. 19A-D illustrate screen saver 507 and the elements of the invention. After the ergonomic accessory 500 is affixed to the PED the screen saver 507 is affixed to the upper surface of base layer 501.

Figure 20:
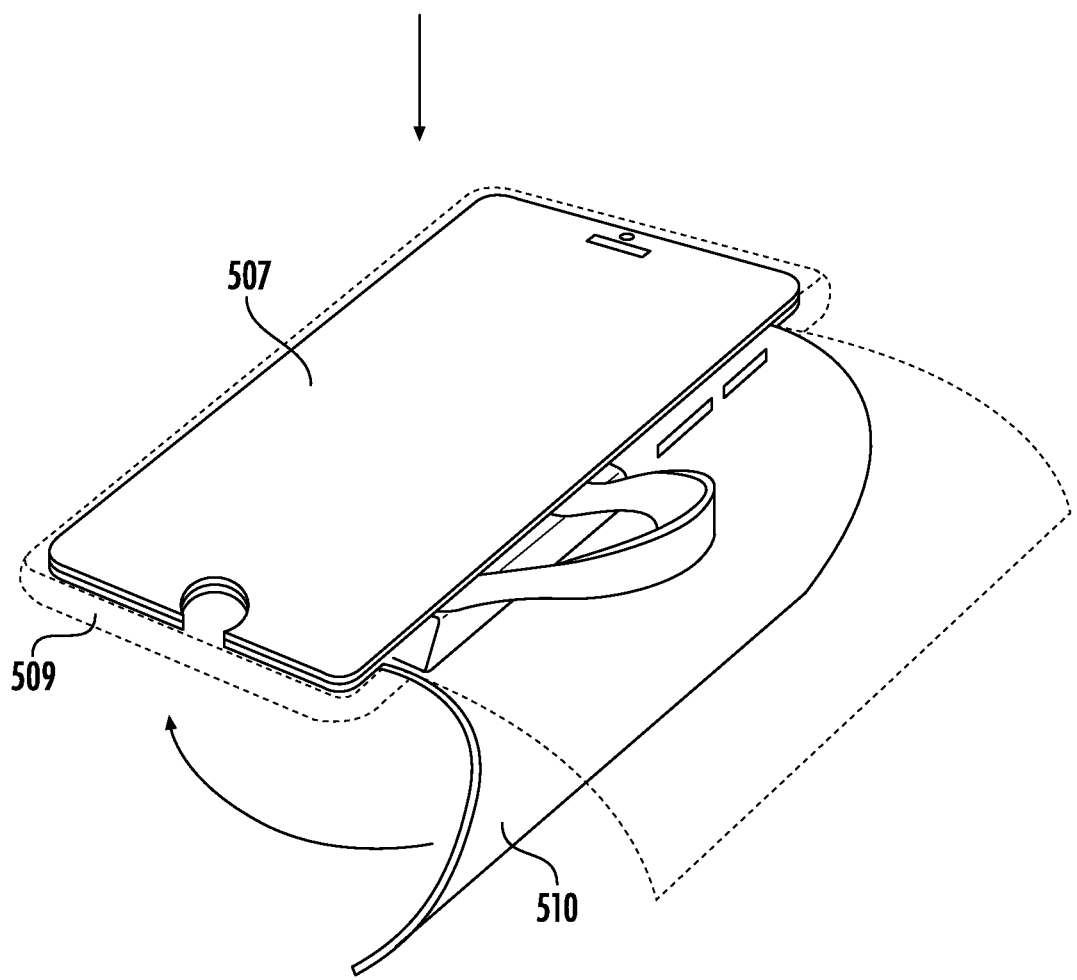
FIG. 20 depicts the manner in which the ninth embodiment of the ergonomic accessory is affixed to a PED.

FIG. 20 depicts the manner in which the ergonomic accessory 500 is affixed to the PED 509. First the elements of the ergonomic accessory are assembled. Then the base layer 501 is affixed to the screen of PED 509 and then the screen saver 507 is affixed to the base layer. Backing layer 510 then is folded under the PED and affixed to the back of the PED. The screen saver 507 can be affixed to the base layer 501 before or after the backing layer is affixed to the back of the PED.

Figure 21A:
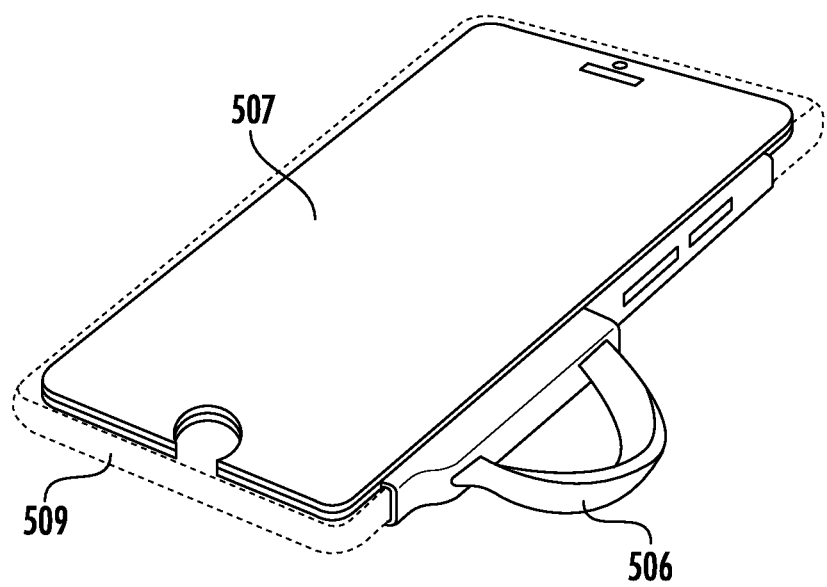
FIGS. 21A and B illustrate in front and back perspective, respectively, the ergonomic accessory of the ninth embodiment installed on a PED.
Figure 21B:
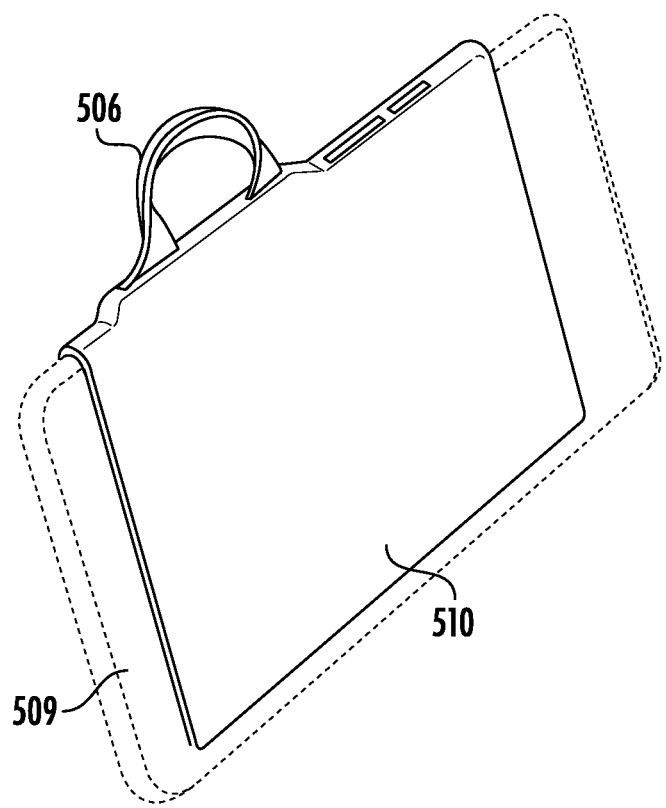

FIG. 21A is a top perspective view of a PED having the ergonomic accessory of the invention affixed thereto. And FIG. 21B is a bottom perspective view of a PED having the ergonomic accessory of the invention affixed thereto.

What is claimed is:

1. An ergonomic accessory for a portable hand-held electronic device, wherein the portable hand-held electronic device has a screen side, an opposite back side, a length defined between a bottom edge and an opposite top edge and a side edge connecting the screen side and the opposite back side along the length between the bottom edge and the opposite top edge, the accessory comprising:
    a film layer having a length defined between a bottom edge of the film layer and an opposite top edge of the film layer and a width defined between a first side edge of the film layer and an opposite second side edge of the film layer, wherein the film layer is partitioned along the length of the film layer to provide a first width portion and a second width portion provided between the first width portion and a third width portion, wherein the second width portion and the third width portion is foldable with respect to the first width portion such that first width portion contacts the screen side, the second width portion folds around the side edge and the third width portion folds around the opposite back side of the portable hand-held electronic device when the accessory and the portable hand-held electronic device are joined together; and
    a tether provided at the second width portion of the film layer such that the tether is secured to the second width portion of the film layer and extends outwardly away from the second width portion of the film layer and the side edge of the portable hand-held electronic device when the accessory and the portable hand-held electronic device are joined together, wherein the tether is configured to receiving at least one finger of a user of the portable hand-held electronic device when the accessory and the portable hand-held electronic device are joined together and the accessory couples the at least one finger of the user to the portable hand-held electronic device.

2. The accessory according to claim 1, wherein the film layer is a plastic film underlayment for affixing a screen protector for the portable hand-held electronic device thereto.

3. The accessory according to claim 2, wherein the screen protector is affixed to the plastic film underlayment of the film layer and comprises plastic or glass.

4. The accessory according to claim 1, further comprising:
    a screen protector affixed to a top side of film layer opposite with respect to the screen side of the portable hand-held electronic device when the accessory and the portable hand-held electronic device are joined together.

5. The accessory according to claim 1, wherein the first width portion of the film layer is affixed to the screen side of the portable hand-held electronic device and the third width portion of the film layer is affixed to the screen side of the portable hand-held electronic device when the accessory and the portable hand-held electronic device are joined together.

6. The accessory according to claim 1, wherein film layer comprises an adhesive film for affixing the accessory to the portable hand-held electronic device when the accessory and the portable hand-held electronic device are joined together.

7. The accessory according to claim 1, further comprising:
    ends of the tether are received within a pocket of the second width portion of the film layer such that the tether is secured to the accessory via the ends of the tether and the pocket.

8. The accessory according to claim 7, further comprising:
    A buttress received in the pocket of the second width portion for securing the tether to the accessory.

9. An ergonomic accessory for a portable hand-held electronic device, wherein the portable hand-held electronic device has a screen side, an opposite back side, a length defined between a bottom edge and an opposite top edge and a side edge connecting the screen side and the opposite back side along the length between the bottom edge and the opposite top edge, the accessory comprising:
    a base layer having a first width defined between a first edge of the base layer and an opposite second edge of the base layer;
    a backing layer having a second width defined between a first edge of the backing layer and an opposite second edge of the backing layer;
    a pocket connecting the opposite second edge of the base layer to the first edge of the backing layer such that the base layer extends in a first direction across the first width of the base layer, the backing layer extends in the first direction across the second width of the backing layer and the pocket extends in a second direction between the base and backing layers, wherein the first direction is different than the second direction; and
    a tether extends outwardly away from the pocket and the side edge of the portable hand-held electronic device when the accessory and the portable hand-held electronic device are joined together, the tether is configured to receiving at least one finger of a user of the portable hand-held electronic device when the accessory and the portable hand-held electronic device are joined together and the accessory couples the at least one finger of the user to the portable hand-held electronic device.

10. The accessory according to claim 9, wherein the base layer, the backing layer and the pocket are made of a single piece of material.

11. The accessory according to claim 10, wherein the single piece of material is a single piece of adhesive backed material.

12. The accessory according to claim 9, further comprising:
    a screen protector, comprising plastic or glass, affixable to the base layer, wherein the base layer is a plastic film underlayment for the screen protector.

13. The accessory according to claim 9, further comprising:
- ends of the tether received within the pocket for securing the tether to the accessory.

14. The accessory according to claim 13, further comprising:
- a buttress received within the pocket for securing the tether to the accessory.

15. The accessory according to claim 9, further comprising:
- an adhesive backing provide on an underside of the base layer and an underside of the backing layer for affixing the accessory to the portable hand-held electronic device.

16. The accessory according to claim 9, wherein, when the accessory and the portable hand-held electronic device are joined together, the base layer is affixed to the screen side of the portable hand-held electronic device and the backing layer is affixed to the back side of the portable hand-held electronic device.

* * * * *